US009210392B2

(12) United States Patent
Nisenzon et al.

(10) Patent No.: US 9,210,392 B2
(45) Date of Patent: Dec. 8, 2015

(54) CAMERA MODULES PATTERNED WITH PI FILTER GROUPS

(71) Applicant: Pelican Imaging Corporation, Santa Clara, CA (US)

(72) Inventors: Semyon Nisenzon, Palo Alto, CA (US); Kartik Venkataraman, San Jose, CA (US)

(73) Assignee: Pelican Imaging Coporation, Santa Clara, CA (US)

( * ) Notice: Subject to any disclaimer, the term of this patent is extended or adjusted under 35 U.S.C. 154(b) by 0 days.

(21) Appl. No.: 13/875,248

(22) Filed: May 1, 2013

(65) Prior Publication Data

US 2013/0293760 A1 Nov. 7, 2013

Related U.S. Application Data

(60) Provisional application No. 61/641,165, filed on May 1, 2012.

(51) Int. Cl.

*H04N 5/335* (2011.01)
*H04N 9/73* (2006.01)
*H01L 27/146* (2006.01)

(52) U.S. Cl.

CPC .......... *H04N 9/735* (2013.01); *H01L 27/14621* (2013.01); *H01L 27/14685* (2013.01); *H01L 27/14627* (2013.01)

(58) Field of Classification Search

CPC ..... H04N 9/04; H04N 9/735; H01L 27/14621
USPC .................................................. 348/279–280
See application file for complete search history.

(56) References Cited

U.S. PATENT DOCUMENTS 4,124,798 A 11/1978 Thompson
4,198,646 A 4/1980 Alexander et al.
4,323,925 A 4/1982 Abell et al.

(Continued)

FOREIGN PATENT DOCUMENTS

CN 1839394 A 9/2006
EP 840502 A2 5/1998

(Continued)

OTHER PUBLICATIONS

Fischer et al., Optical System Design, 2nd Edition, SPIE Press, 191-198.

(Continued)

*Primary Examiner* — Nhan T Tran
*Assistant Examiner* — Chan Nguyen
(74) *Attorney, Agent, or Firm* — KPPB LLP

(57) ABSTRACT

Systems and methods in accordance with embodiments of the invention pattern array camera modules with π filter groups. In one embodiment, an array camera module includes: an M×N imager array including a plurality of focal planes, where each focal plane includes an array of pixels; an M×N optic array of lens stacks, where each lens stack corresponds to a focal plane, and where each lens stack forms an image of a scene on its corresponding focal plane; where each pairing of a lens stack and focal plane thereby defines a camera; where at least one row in the M×N array of cameras includes at least one red camera, one green camera, and one blue camera; and where at least one column in the M×N array of cameras includes at least one red camera, one green camera, and one blue camera.

20 Claims, 12 Drawing Sheets

(56) References Cited

U.S. PATENT DOCUMENTS 4,460,449 A 7/1984 Montalbano
4,467,365 A 8/1984 Murayama et al.
5,005,083 A 4/1991 Grage
5,070,414 A 12/1991 Tsutsumi
5,144,448 A 9/1992 Hornbaker et al.
5,327,125 A 7/1994 Iwase et al.
5,629,524 A 5/1997 Stettner et al.
5,808,350 A 9/1998 Jack et al.
5,832,312 A 11/1998 Rieger et al.
5,880,691 A 3/1999 Fossum et al.
5,933,190 A 8/1999 Dierickx et al.
5,973,844 A 10/1999 Burger
6,002,743 A 12/1999 Telymonde
6,005,607 A 12/1999 Uomori et al.
6,034,690 A 3/2000 Gallery et al.
6,069,351 A 5/2000 Mack
6,069,365 A 5/2000 Chow et al.
6,097,394 A 8/2000 Levoy et al.
6,124,974 A 9/2000 Burger
6,137,100 A 10/2000 Fossum et al.
6,137,535 A 10/2000 Meyers
6,141,048 A 10/2000 Meyers
6,160,909 A 12/2000 Melen
6,163,414 A 12/2000 Kikuchi et al.
6,172,352 B1 1/2001 Liu et al.
6,175,379 B1 1/2001 Uomori et al.
6,205,241 B1 3/2001 Melen
6,239,909 B1 5/2001 Hayashi et al.
6,358,862 B1 3/2002 Ireland et al.
6,443,579 B1 9/2002 Myers
6,476,805 B1 11/2002 Shum et al.
6,477,260 B1 11/2002 Shimomura
6,502,097 B1 12/2002 Chan et al.
6,525,302 B2 2/2003 Dowski, Jr. et al.
6,563,537 B1 5/2003 Kawamura et al.
6,571,466 B1 6/2003 Glenn et al.
6,603,513 B1 8/2003 Berezin
6,611,289 B1 8/2003 Yu
6,627,896 B1 9/2003 Hashimoto et al.
6,628,330 B1 9/2003 Lin
6,635,941 B2 10/2003 Suda
6,639,596 B1 10/2003 Shum et al.
6,657,218 B2 12/2003 Noda
6,671,399 B1 12/2003 Berestov
6,750,904 B1 6/2004 Lambert
6,765,617 B1 7/2004 Tangen et al.
6,771,833 B1 8/2004 Edgar
6,774,941 B1 8/2004 Boisvert et al.
6,795,253 B2 9/2004 Shinohara
6,819,358 B1 11/2004 Kagle et al.
6,879,735 B1 4/2005 Portniaguine et al.
6,903,770 B1 6/2005 Kobayashi et al.
6,909,121 B2 6/2005 Nishikawa
6,927,922 B2 8/2005 George et al.
6,958,862 B1 10/2005 Joseph
7,015,954 B1 3/2006 Foote et al.
7,085,409 B2 8/2006 Sawhney et al.
7,161,614 B1 1/2007 Yamashita et al.
7,199,348 B2 4/2007 Olsen et al.
7,235,785 B2 6/2007 Hornback et al.
7,262,799 B2 8/2007 Suda
7,292,735 B2 11/2007 Blake et al.
7,295,697 B1 11/2007 Satoh
7,369,165 B2 5/2008 Bosco et al.
7,391,572 B2 6/2008 Jacobowitz et al.
7,408,725 B2 8/2008 Sato
7,425,984 B2 9/2008 Chen
7,606,484 B1 10/2009 Richards et al.
7,633,511 B2 12/2009 Shum et al.
7,639,435 B2 12/2009 Chiang et al.
7,646,549 B2 1/2010 Zalevsky et al.
7,657,090 B2 2/2010 Omatsu et al.
7,675,080 B2 3/2010 Boettiger
7,675,681 B2 3/2010 Tomikawa et al.
7,706,634 B2 4/2010 Schmitt et al.
7,723,662 B2 5/2010 Levoy et al.
7,738,013 B2 6/2010 Galambos et al.
7,782,364 B2 8/2010 Smith
7,826,153 B2 11/2010 Hong
7,840,067 B2 11/2010 Shen et al.
7,912,673 B2 3/2011 Hébert et al.
7,973,834 B2 7/2011 Yang
7,986,018 B2 7/2011 Rennie
7,990,447 B2 8/2011 Honda et al.
8,000,498 B2 8/2011 Shih et al.
8,013,904 B2 9/2011 Tan et al.
8,027,531 B2 9/2011 Wilburn et al.
8,044,994 B2 10/2011 Vetro et al.
8,077,245 B2 12/2011 Adamo et al.
8,098,297 B2 1/2012 Crisan et al.
8,098,304 B2 1/2012 Pinto et al.
8,106,949 B2 1/2012 Tan et al.
8,126,279 B2 2/2012 Marcellin et al.
8,130,120 B2 3/2012 Kawabata et al.
8,131,097 B2 3/2012 Lelescu et al.
8,164,629 B1 4/2012 Zhang
8,169,486 B2 5/2012 Corcoran et al.
8,180,145 B2 5/2012 Wu et al.
8,189,065 B2 5/2012 Georgiev et al.
8,189,089 B1 5/2012 Georgiev
8,212,914 B2 7/2012 Chiu
8,213,711 B2 7/2012 Tam
8,231,814 B2 7/2012 Duparre
8,242,426 B2 8/2012 Ward et al.
8,244,027 B2 8/2012 Takahashi
8,244,058 B1 8/2012 Intwala et al.
8,254,668 B2 8/2012 Mashitani et al.
8,279,325 B2 10/2012 Pitts et al.
8,280,194 B2 10/2012 Wong et al.
8,289,409 B2 10/2012 Chang
8,289,440 B2 10/2012 Pitts et al.
8,290,358 B1 10/2012 Georgiev
8,294,099 B2 10/2012 Blackwell, Jr.
8,305,456 B1 11/2012 McMahon
8,315,476 B1 11/2012 Georgiev et al.
8,345,144 B1 1/2013 Georgiev et al.
8,360,574 B2 1/2013 Ishak et al.
8,400,555 B1 3/2013 Georgiev
8,406,562 B2 3/2013 Bassi et al.
8,446,492 B2 5/2013 Nakano et al.
8,456,517 B2 6/2013 Mor et al.
8,493,496 B2 7/2013 Freedman et al.
8,514,491 B2 8/2013 Duparre
8,541,730 B2 9/2013 Inuiya
8,542,933 B2 9/2013 Venkataraman et al.
8,553,093 B2 10/2013 Wong et al.
8,559,756 B2 10/2013 Georgiev et al.
8,581,995 B2 11/2013 Lin et al.
8,619,082 B1 12/2013 Ciurea et al.
8,648,918 B2 2/2014 Kauker et al.
8,655,052 B2 2/2014 Spooner et al.
8,682,107 B2 3/2014 Yoon et al.
8,687,087 B2 4/2014 Pertsel et al.
8,692,893 B2 4/2014 McMahon
8,773,536 B1 7/2014 Zhang
8,780,113 B1 7/2014 Ciurea et al.
8,804,255 B2 8/2014 Duparre
8,830,375 B2 9/2014 Ludwig
8,831,367 B2 9/2014 Venkataraman et al.
8,842,201 B2 9/2014 Tajiri
8,854,462 B2 10/2014 Herbin et al.
8,861,089 B2 10/2014 Duparre
8,866,912 B2 10/2014 Mullis
8,866,920 B2 10/2014 Venkataraman et al.
8,866,951 B2 10/2014 Keelan
8,878,950 B2 11/2014 Lelescu et al.
8,885,059 B1 11/2014 Venkataraman et al.
8,896,594 B2 11/2014 Xiong et al.
8,896,719 B1 11/2014 Venkataraman et al.
8,902,321 B2 12/2014 Venkataraman et al.
8,928,793 B2 1/2015 Mcmahon
9,019,426 B2 4/2015 Han et al.
9,025,894 B2 5/2015 Venkataraman et al.
9,025,895 B2 5/2015 Venkataraman et al.

(56) References Cited

U.S. PATENT DOCUMENTS

| | | | |
|---|---|---|---|
| 9,030,528 B2 | 5/2015 | Shpunt et al. | |
| 9,031,335 B2 | 5/2015 | Venkataraman et al. | |
| 9,031,342 B2 | 5/2015 | Venkataraman et al. | |
| 9,031,343 B2 | 5/2015 | Venkataraman et al. | |
| 9,036,928 B2 | 5/2015 | Venkataraman et al. | |
| 9,036,931 B2 | 5/2015 | Venkataraman et al. | |
| 9,041,823 B2 | 5/2015 | Venkataraman et al. | |
| 9,041,824 B2 | 5/2015 | Lelescu et al. | |
| 9,041,829 B2 | 5/2015 | Venkataraman et al. | |
| 9,042,667 B2 | 5/2015 | Venkataraman et al. | |
| 2001/0005225 A1 | 6/2001 | Clark et al. | |
| 2001/0019621 A1 | 9/2001 | Hanna et al. | |
| 2001/0038387 A1 | 11/2001 | Tomooka et al. | |
| 2002/0012056 A1 | 1/2002 | Trevino | |
| 2002/0027608 A1 | 3/2002 | Johnson | |
| 2002/0039438 A1 | 4/2002 | Mori et al. | |
| 2002/0057845 A1 | 5/2002 | Fossum | |
| 2002/0063807 A1 | 5/2002 | Margulis | |
| 2002/0087403 A1 | 7/2002 | Meyers et al. | |
| 2002/0089596 A1 | 7/2002 | Suda | |
| 2002/0094027 A1 | 7/2002 | Sato et al. | |
| 2002/0101528 A1 | 8/2002 | Lee | |
| 2002/0113867 A1 | 8/2002 | Takigawa et al. | |
| 2002/0113888 A1 | 8/2002 | Sonoda et al. | |
| 2002/0163054 A1 | 11/2002 | Suda et al. | |
| 2002/0167537 A1 | 11/2002 | Trajkovic | |
| 2002/0177054 A1 | 11/2002 | Saitoh et al. | |
| 2003/0025227 A1 | 2/2003 | Daniell | |
| 2003/0086079 A1 | 5/2003 | Barth et al. | |
| 2003/0124763 A1 | 7/2003 | Fan et al. | |
| 2003/0140347 A1 | 7/2003 | Varsa | |
| 2003/0179418 A1 | 9/2003 | Wengender et al. | |
| 2003/0190072 A1 | 10/2003 | Adkins et al. | |
| 2003/0211405 A1 | 11/2003 | Venkataraman | |
| 2004/0008271 A1 | 1/2004 | Hagimori et al. | |
| 2004/0012689 A1 | 1/2004 | Tinnerino | |
| 2004/0027358 A1 | 2/2004 | Nakao | |
| 2004/0047274 A1 | 3/2004 | Amanai | |
| 2004/0050104 A1 | 3/2004 | Ghosh et al. | |
| 2004/0056966 A1 | 3/2004 | Schechner et al. | |
| 2004/0061787 A1 | 4/2004 | Liu et al. | |
| 2004/0066454 A1 | 4/2004 | Otani et al. | |
| 2004/0100570 A1 | 5/2004 | Shizukuishi | |
| 2004/0114807 A1 | 6/2004 | Lelescu et al. | |
| 2004/0151401 A1 | 8/2004 | Sawhney et al. | |
| 2004/0165090 A1 | 8/2004 | Ning | |
| 2004/0169617 A1 | 9/2004 | Yelton et al. | |
| 2004/0170340 A1 | 9/2004 | Tipping et al. | |
| 2004/0174439 A1 | 9/2004 | Upton | |
| 2004/0179834 A1 | 9/2004 | Szajewski | |
| 2004/0207836 A1 | 10/2004 | Chhibber et al. | |
| 2004/0213449 A1 | 10/2004 | Safaee-Rad et al. | |
| 2004/0218809 A1 | 11/2004 | Blake et al. | |
| 2004/0234873 A1 | 11/2004 | Venkataraman | |
| 2004/0240052 A1 | 12/2004 | Minefuji et al. | |
| 2004/0251509 A1 | 12/2004 | Choi | |
| 2004/0264806 A1 | 12/2004 | Herley | |
| 2005/0006477 A1 | 1/2005 | Patel | |
| 2005/0007461 A1 | 1/2005 | Chou et al. | |
| 2005/0009313 A1 | 1/2005 | Suzuki et al. | |
| 2005/0012035 A1 | 1/2005 | Miller | |
| 2005/0036778 A1 | 2/2005 | DeMonte | |
| 2005/0047678 A1 | 3/2005 | Jones et al. | |
| 2005/0048690 A1 | 3/2005 | Yamamoto | |
| 2005/0068436 A1 | 3/2005 | Fraenkel et al. | |
| 2005/0128595 A1 | 6/2005 | Shimizu | |
| 2005/0132098 A1 | 6/2005 | Sonoda et al. | |
| 2005/0134712 A1 | 6/2005 | Gruhlke et al. | |
| 2005/0147277 A1 | 7/2005 | Higaki et al. | |
| 2005/0151759 A1 | 7/2005 | Gonzalez-Banos et al. | |
| 2005/0175257 A1 | 8/2005 | Kuroki | |
| 2005/0185711 A1 | 8/2005 | Pfister et al. | |
| 2005/0205785 A1 | 9/2005 | Hornback et al. | |
| 2005/0219363 A1 | 10/2005 | Kohler | |
| 2005/0224843 A1 | 10/2005 | Boemler | |
| 2005/0225654 A1* | 10/2005 | Feldman et al. | 348/272 |
| 2005/0275946 A1 | 12/2005 | Choo et al. | |
| 2005/0286612 A1 | 12/2005 | Takanashi | |
| 2006/0002635 A1 | 1/2006 | Nestares et al. | |
| 2006/0007331 A1 | 1/2006 | Izumi et al. | |
| 2006/0023197 A1 | 2/2006 | Joel | |
| 2006/0023314 A1 | 2/2006 | Boettiger et al. | |
| 2006/0033005 A1 | 2/2006 | Jerdev et al. | |
| 2006/0034003 A1 | 2/2006 | Zalevsky | |
| 2006/0038891 A1 | 2/2006 | Okutomi et al. | |
| 2006/0049930 A1 | 3/2006 | Zruya et al. | |
| 2006/0054780 A1 | 3/2006 | Garrood et al. | |
| 2006/0054782 A1 | 3/2006 | Olsen et al. | |
| 2006/0055811 A1 | 3/2006 | Frtiz et al. | |
| 2006/0069478 A1 | 3/2006 | Iwama | |
| 2006/0072029 A1* | 4/2006 | Miyatake et al. | 348/340 |
| 2006/0087747 A1 | 4/2006 | Ohzawa et al. | |
| 2006/0098888 A1 | 5/2006 | Morishita | |
| 2006/0125936 A1 | 6/2006 | Gruhike et al. | |
| 2006/0138322 A1 | 6/2006 | Costello et al. | |
| 2006/0152803 A1 | 7/2006 | Provitola | |
| 2006/0157640 A1 | 7/2006 | Perlman et al. | |
| 2006/0159369 A1 | 7/2006 | Young | |
| 2006/0176566 A1 | 8/2006 | Boettiger et al. | |
| 2006/0187338 A1 | 8/2006 | May et al. | |
| 2006/0197937 A1 | 9/2006 | Bamji et al. | |
| 2006/0203113 A1* | 9/2006 | Wada et al. | 348/302 |
| 2006/0210186 A1 | 9/2006 | Berkner | |
| 2006/0214085 A1 | 9/2006 | Olsen | |
| 2006/0239549 A1 | 10/2006 | Kelly et al. | |
| 2006/0243889 A1 | 11/2006 | Farnworth et al. | |
| 2006/0251410 A1 | 11/2006 | Trutna | |
| 2006/0274174 A1 | 12/2006 | Tewinkle | |
| 2006/0278948 A1 | 12/2006 | Yamaguchi et al. | |
| 2006/0279648 A1 | 12/2006 | Senba et al. | |
| 2007/0002159 A1 | 1/2007 | Olsen et al. | |
| 2007/0024614 A1 | 2/2007 | Tam | |
| 2007/0036427 A1 | 2/2007 | Nakamura et al. | |
| 2007/0040828 A1 | 2/2007 | Zalevsky et al. | |
| 2007/0040922 A1 | 2/2007 | McKee et al. | |
| 2007/0041391 A1 | 2/2007 | Lin et al. | |
| 2007/0052825 A1 | 3/2007 | Cho | |
| 2007/0083114 A1 | 4/2007 | Yang et al. | |
| 2007/0085917 A1 | 4/2007 | Kobayashi | |
| 2007/0102622 A1 | 5/2007 | Olsen et al. | |
| 2007/0126898 A1 | 6/2007 | Feldman | |
| 2007/0127831 A1 | 6/2007 | Venkataraman | |
| 2007/0139333 A1 | 6/2007 | Sato et al. | |
| 2007/0146511 A1 | 6/2007 | Kinoshita et al. | |
| 2007/0158427 A1 | 7/2007 | Zhu et al. | |
| 2007/0159541 A1 | 7/2007 | Sparks et al. | |
| 2007/0160310 A1 | 7/2007 | Tanida et al. | |
| 2007/0165931 A1 | 7/2007 | Higaki | |
| 2007/0171290 A1 | 7/2007 | Kroger | |
| 2007/0182843 A1 | 8/2007 | Shimamura et al. | |
| 2007/0206241 A1 | 9/2007 | Smith et al. | |
| 2007/0211164 A1 | 9/2007 | Olsen et al. | |
| 2007/0216765 A1 | 9/2007 | Wong et al. | |
| 2007/0228256 A1 | 10/2007 | Mentzer et al. | |
| 2007/0257184 A1 | 11/2007 | Olsen et al. | |
| 2007/0258006 A1 | 11/2007 | Olsen et al. | |
| 2007/0258706 A1 | 11/2007 | Raskar et al. | |
| 2007/0263114 A1 | 11/2007 | Gurevich et al. | |
| 2007/0268374 A1 | 11/2007 | Robinson | |
| 2007/0296832 A1 | 12/2007 | Ota et al. | |
| 2007/0296835 A1 | 12/2007 | Olsen et al. | |
| 2007/0296847 A1 | 12/2007 | Chang et al. | |
| 2008/0006859 A1 | 1/2008 | Mionetto | |
| 2008/0019611 A1 | 1/2008 | Larkin | |
| 2008/0025649 A1 | 1/2008 | Liu et al. | |
| 2008/0030597 A1 | 2/2008 | Olsen et al. | |
| 2008/0043095 A1 | 2/2008 | Vetro et al. | |
| 2008/0043096 A1 | 2/2008 | Vetro et al. | |
| 2008/0054518 A1 | 3/2008 | Ra et al. | |
| 2008/0062164 A1 | 3/2008 | Bassi et al. | |
| 2008/0079805 A1 | 4/2008 | Takagi et al. | |
| 2008/0080028 A1 | 4/2008 | Bakin et al. | |
| 2008/0084486 A1 | 4/2008 | Enge et al. | |
| 2008/0088793 A1 | 4/2008 | Sverdrup et al. | |

(56) References Cited

U.S. PATENT DOCUMENTS

2008/0095523 A1 4/2008 Schilling-Benz et al.
2008/0099804 A1 5/2008 Venezia et al.
2008/0112635 A1 5/2008 Kondo et al.
2008/0118241 A1 5/2008 Tekolste et al.
2008/0131019 A1 6/2008 Ng
2008/0131107 A1 6/2008 Ueno
2008/0151097 A1 6/2008 Chen et al.
2008/0152215 A1 6/2008 Horie et al.
2008/0152296 A1 6/2008 Oh et al.
2008/0158259 A1 7/2008 Kempf et al.
2008/0158375 A1 7/2008 Kakkori et al.
2008/0158698 A1 7/2008 Chang et al.
2008/0187305 A1 8/2008 Raskar et al.
2008/0193026 A1 8/2008 Horie et al.
2008/0218610 A1 9/2008 Chapman et al.
2008/0219654 A1 9/2008 Border et al.
2008/0239116 A1 10/2008 Smith
2008/0240598 A1 10/2008 Hasegawa
2008/0247638 A1 10/2008 Tanida et al.
2008/0247653 A1 10/2008 Moussavi et al.
2008/0272416 A1 11/2008 Yun
2008/0273751 A1 11/2008 Yuan et al.
2008/0278591 A1 11/2008 Barna et al.
2008/0298674 A1 12/2008 Baker et al.
2009/0050946 A1 2/2009 Duparre et al.
2009/0052743 A1 2/2009 Techmer
2009/0060281 A1 3/2009 Tanida et al.
2009/0086074 A1 4/2009 Li et al.
2009/0091806 A1 4/2009 Inuiya
2009/0096050 A1 4/2009 Park
2009/0102956 A1 4/2009 Georgiev
2009/0109306 A1 4/2009 Shan et al.
2009/0128833 A1 5/2009 Yahav
2009/0140131 A1 6/2009 Utagawa et al.
2009/0152664 A1 6/2009 Klem et al.
2009/0167922 A1 7/2009 Perlman et al.
2009/0179142 A1 7/2009 Duparre et al.
2009/0180021 A1 7/2009 Kikuchi et al.
2009/0200622 A1 8/2009 Tai et al.
2009/0201371 A1 8/2009 Matsuda et al.
2009/0207235 A1 8/2009 Francini et al.
2009/0219435 A1 9/2009 Yuan et al.
2009/0225203 A1 9/2009 Tanida et al.
2009/0237520 A1 9/2009 Kaneko et al.
2009/0245573 A1 10/2009 Saptharishi et al.
2009/0263017 A1 10/2009 Tanbakuchi
2009/0268192 A1 10/2009 Koenck et al.
2009/0268970 A1 10/2009 Babacan et al.
2009/0268983 A1 10/2009 Stone
2009/0274387 A1 11/2009 Jin
2009/0284651 A1 11/2009 Srinivasan
2009/0297056 A1 12/2009 Lelescu et al.
2009/0302205 A9 12/2009 Olsen et al.
2009/0323195 A1 12/2009 Hembree et al.
2009/0323206 A1 12/2009 Oliver et al.
2009/0324118 A1 12/2009 Maslov et al.
2010/0002126 A1 1/2010 Wenstrand et al.
2010/0002313 A1 1/2010 Duparre et al.
2010/0002314 A1 1/2010 Duparre
2010/0013927 A1 1/2010 Nixon
2010/0044815 A1 2/2010 Chang et al.
2010/0053342 A1 3/2010 Hwang et al.
2010/0053600 A1 3/2010 Tanida et al.
2010/0060746 A9 3/2010 Olsen et al.
2010/0073463 A1 3/2010 Momonoi et al.
2010/0074532 A1 3/2010 Gordon et al.
2010/0085425 A1 4/2010 Tan
2010/0086227 A1 4/2010 Sun et al.
2010/0091389 A1 4/2010 Henriksen et al.
2010/0097491 A1 4/2010 Farina et al.
2010/0103259 A1 4/2010 Tanida et al.
2010/0103308 A1 4/2010 Butterfield et al.
2010/0111444 A1 5/2010 Coffman
2010/0118127 A1 5/2010 Nam et al.
2010/0128145 A1 5/2010 Pitts et al.
2010/0133230 A1 6/2010 Henriksen et al.
2010/0133418 A1 6/2010 Sargent et al.
2010/0141802 A1 6/2010 Knight et al.
2010/0142839 A1 6/2010 Lakus-Becker
2010/0157073 A1 6/2010 Kondo et al.
2010/0165152 A1 7/2010 Lim
2010/0166410 A1 7/2010 Chang et al.
2010/0177411 A1 7/2010 Hegde et al.
2010/0194901 A1 8/2010 van Hoorebeke et al.
2010/0195716 A1 8/2010 Klein et al.
2010/0201834 A1 8/2010 Maruyama et al.
2010/0208100 A9 8/2010 Olsen et al.
2010/0220212 A1 9/2010 Perlman et al.
2010/0231285 A1 9/2010 Boomer et al.
2010/0244165 A1 9/2010 Lake et al.
2010/0265381 A1 10/2010 Yamamoto et al.
2010/0265385 A1 10/2010 Knight et al.
2010/0281070 A1 11/2010 Chan et al.
2010/0302423 A1 12/2010 Adams, Jr. et al.
2010/0309292 A1 12/2010 Ho et al.
2010/0321595 A1 12/2010 Chiu
2011/0001037 A1 1/2011 Tewinkle
2011/0018973 A1 1/2011 Takayama
2011/0019243 A1 1/2011 Constant, Jr. et al.
2011/0031381 A1 2/2011 Tay et al.
2011/0032370 A1 2/2011 Ludwig
2011/0043661 A1 2/2011 Podoleanu
2011/0043665 A1 2/2011 Ogasahara
2011/0043668 A1 2/2011 McKinnon et al.
2011/0069189 A1 3/2011 Venkataraman et al.
2011/0080487 A1 4/2011 Venkataraman et al.
2011/0108708 A1 5/2011 Olsen et al.
2011/0121421 A1 5/2011 Charbon et al.
2011/0122308 A1 5/2011 Duparre
2011/0128393 A1 6/2011 Tavi et al.
2011/0128412 A1 6/2011 Milnes et al.
2011/0149408 A1 6/2011 Hahgholt et al.
2011/0149409 A1 6/2011 Haugholt et al.
2011/0153248 A1 6/2011 Gu et al.
2011/0157321 A1 6/2011 Nakajima et al.
2011/0176020 A1 7/2011 Chang
2011/0211824 A1 9/2011 Georgiev et al.
2011/0221599 A1 9/2011 Högasten
2011/0221658 A1 9/2011 Haddick et al.
2011/0221939 A1 * 9/2011 Jerdev .......................... 348/246
2011/0221950 A1 9/2011 Oostra
2011/0228144 A1 9/2011 Tian et al.
2011/0234841 A1 9/2011 Akeley et al.
2011/0241234 A1 10/2011 Duparre
2011/0242342 A1 10/2011 Goma et al.
2011/0242355 A1 10/2011 Goma et al.
2011/0242356 A1 10/2011 Aleksic
2011/0255592 A1 10/2011 Sung et al.
2011/0255745 A1 10/2011 Hodder et al.
2011/0261993 A1 10/2011 Weiming et al.
2011/0267348 A1 11/2011 Lin et al.
2011/0273531 A1 11/2011 Ito et al.
2011/0274366 A1 11/2011 Tardif
2011/0279721 A1 11/2011 McMahon
2011/0285866 A1 11/2011 Bhrugumalla et al.
2011/0285910 A1 11/2011 Bamji et al.
2011/0298917 A1 12/2011 Yanagita
2011/0300929 A1 12/2011 Tardif et al.
2011/0310980 A1 12/2011 Mathew
2011/0316968 A1 12/2011 Taguchi et al.
2011/0317766 A1 12/2011 Lim, II et al.
2012/0012748 A1 1/2012 Pain et al.
2012/0026297 A1 2/2012 Sato
2012/0026342 A1 2/2012 Yu et al.
2012/0039525 A1 2/2012 Tian et al.
2012/0044249 A1 2/2012 Mashitani et al.
2012/0044372 A1 2/2012 Côtéet al.
2012/0069235 A1 3/2012 Imai
2012/0105691 A1 5/2012 Waqas et al.
2012/0113413 A1 5/2012 Miahczylowicz-Wolski et al.
2012/0147139 A1 6/2012 Li et al.
2012/0147205 A1 6/2012 Lelescu et al.
2012/0153153 A1 6/2012 Chang et al.
2012/0154551 A1 6/2012 Inoue

(56) References Cited

U.S. PATENT DOCUMENTS

| | | | |
|---|---|---|---|
| 2012/0170134 | A1 | 7/2012 | Bolis et al. |
| 2012/0176479 | A1 | 7/2012 | Mayhew et al. |
| 2012/0188389 | A1 | 7/2012 | Lin et al. |
| 2012/0188420 | A1 | 7/2012 | Black et al. |
| 2012/0188634 | A1 | 7/2012 | Kubala et al. |
| 2012/0198677 | A1 | 8/2012 | Duparre |
| 2012/0200734 | A1 | 8/2012 | Tang |
| 2012/0229628 | A1 | 9/2012 | Ishiyama et al. |
| 2012/0249550 | A1 | 10/2012 | Akeley et al. |
| 2012/0249836 | A1 | 10/2012 | Ali et al. |
| 2012/0262607 | A1 | 10/2012 | Shimura et al. |
| 2012/0268574 | A1 | 10/2012 | Gidon et al. |
| 2012/0287291 | A1 | 11/2012 | McMahon |
| 2012/0293695 | A1 | 11/2012 | Tanaka |
| 2012/0307099 | A1 | 12/2012 | Yahata et al. |
| 2012/0314033 | A1 | 12/2012 | Lee et al. |
| 2012/0327222 | A1 | 12/2012 | Ng et al. |
| 2013/0002828 | A1 | 1/2013 | Ding et al. |
| 2013/0003184 | A1 | 1/2013 | Duparre |
| 2013/0010073 | A1 | 1/2013 | Do |
| 2013/0016885 | A1 | 1/2013 | Tsujimoto |
| 2013/0022111 | A1 | 1/2013 | Chen et al. |
| 2013/0027580 | A1 | 1/2013 | Olsen et al. |
| 2013/0033579 | A1 | 2/2013 | Wajs |
| 2013/0050504 | A1 | 2/2013 | Safaee-Rad et al. |
| 2013/0050526 | A1 | 2/2013 | Keelan |
| 2013/0057710 | A1 | 3/2013 | Mcmahon |
| 2013/0070060 | A1 | 3/2013 | Chatterjee |
| 2013/0076967 | A1 | 3/2013 | Brunner et al. |
| 2013/0077880 | A1 | 3/2013 | Venkataraman et al. |
| 2013/0077882 | A1 | 3/2013 | Venkataraman et al. |
| 2013/0088489 | A1 | 4/2013 | Schmeitz et al. |
| 2013/0088637 | A1 | 4/2013 | Duparre |
| 2013/0113899 | A1 | 5/2013 | Morohoshi et al. |
| 2013/0120605 | A1 | 5/2013 | Georgiev et al. |
| 2013/0128068 | A1 | 5/2013 | Georgiev et al. |
| 2013/0128069 | A1 | 5/2013 | Georgiev et al. |
| 2013/0128087 | A1 | 5/2013 | Georgiev et al. |
| 2013/0128121 | A1 | 5/2013 | Agarwala et al. |
| 2013/0147979 | A1 | 6/2013 | McMahon et al. |
| 2013/0215108 | A1 | 8/2013 | McMahon et al. |
| 2013/0215231 | A1 | 8/2013 | Hiramoto et al. |
| 2013/0222556 | A1 | 8/2013 | Shimada |
| 2013/0223759 | A1 | 8/2013 | Nishiyama et al. |
| 2013/0229540 | A1 | 9/2013 | Farina et al. |
| 2013/0259317 | A1 | 10/2013 | Gaddy |
| 2013/0265459 | A1 | 10/2013 | Duparre et al. |
| 2013/0274923 | A1 | 10/2013 | By et al. |
| 2013/0293760 | A1 | 11/2013 | Nisenzon et al. |
| 2014/0002674 | A1 | 1/2014 | Duparre et al. |
| 2014/0009586 | A1 | 1/2014 | McNamer et al. |
| 2014/0043507 | A1 | 2/2014 | Wang et al. |
| 2014/0076336 | A1 | 3/2014 | Clayton et al. |
| 2014/0079336 | A1 | 3/2014 | Venkataraman et al. |
| 2014/0092281 | A1 | 4/2014 | Nisenzon et al. |
| 2014/0104490 | A1 | 4/2014 | Hsieh et al. |
| 2014/0118493 | A1 | 5/2014 | Sali et al. |
| 2014/0132810 | A1 | 5/2014 | McMahon |
| 2014/0146201 | A1 | 5/2014 | Knight et al. |
| 2014/0176592 | A1 | 6/2014 | Wilburn et al. |
| 2014/0192253 | A1 | 7/2014 | Laroia |
| 2014/0198188 | A1 | 7/2014 | Izawa |
| 2014/0204183 | A1 | 7/2014 | Lee et al. |
| 2014/0218546 | A1 | 8/2014 | McMahon |
| 2014/0232822 | A1 | 8/2014 | Venkataraman et al. |
| 2014/0240528 | A1 | 8/2014 | Venkataraman et al. |
| 2014/0240529 | A1 | 8/2014 | Venkataraman et al. |
| 2014/0253738 | A1 | 9/2014 | Mullis |
| 2014/0267243 | A1 | 9/2014 | Venkataraman et al. |
| 2014/0267286 | A1 | 9/2014 | Duparre |
| 2014/0267633 | A1 | 9/2014 | Venkataraman et al. |
| 2014/0267762 | A1 | 9/2014 | Mullis et al. |
| 2014/0267890 | A1 | 9/2014 | Lelescu et al. |
| 2014/0285675 | A1 | 9/2014 | Mullis |
| 2014/0313315 | A1 | 10/2014 | Shoham et al. |
| 2014/0321712 | A1 | 10/2014 | Ciurea et al. |
| 2014/0333731 | A1 | 11/2014 | Venkataraman et al. |
| 2014/0333764 | A1 | 11/2014 | Venkataraman et al. |
| 2014/0333787 | A1 | 11/2014 | Venkataraman et al. |
| 2014/0340539 | A1 | 11/2014 | Venkataraman et al. |
| 2014/0347509 | A1 | 11/2014 | Venkataraman et al. |
| 2014/0347748 | A1 | 11/2014 | Duparre |
| 2014/0354773 | A1 | 12/2014 | Venkataraman et al. |
| 2014/0354843 | A1 | 12/2014 | Venkataraman et al. |
| 2014/0354844 | A1 | 12/2014 | Venkataraman et al. |
| 2014/0354853 | A1 | 12/2014 | Venkataraman et al. |
| 2014/0354854 | A1 | 12/2014 | Venkataraman et al. |
| 2014/0354855 | A1 | 12/2014 | Venkataraman et al. |
| 2014/0355870 | A1 | 12/2014 | Venkataraman et al. |
| 2014/0368662 | A1 | 12/2014 | Venkataraman et al. |
| 2014/0368683 | A1 | 12/2014 | Venkataraman et al. |
| 2014/0368684 | A1 | 12/2014 | Venkataraman et al. |
| 2014/0368685 | A1 | 12/2014 | Venkataraman et al. |
| 2014/0368686 | A1 | 12/2014 | Duparre |
| 2014/0369612 | A1 | 12/2014 | Venkataraman et al. |
| 2014/0369615 | A1 | 12/2014 | Venkataraman et al. |
| 2014/0376825 | A1 | 12/2014 | Venkataraman et al. |
| 2014/0376826 | A1 | 12/2014 | Venkataraman et al. |
| 2015/0003752 | A1 | 1/2015 | Venkataraman et al. |
| 2015/0003753 | A1 | 1/2015 | Venkataraman et al. |
| 2015/0009353 | A1 | 1/2015 | Venkataraman et al. |
| 2015/0009354 | A1 | 1/2015 | Venkataraman et al. |
| 2015/0009362 | A1 | 1/2015 | Venkataraman et al. |
| 2015/0015669 | A1 | 1/2015 | Venkataraman et al. |
| 2015/0035992 | A1 | 2/2015 | Mullis |
| 2015/0036014 | A1 | 2/2015 | Lelescu et al. |
| 2015/0036015 | A1 | 2/2015 | Lelescu et al. |
| 2015/0042766 | A1 | 2/2015 | Ciurea et al. |
| 2015/0042767 | A1 | 2/2015 | Ciurea et al. |
| 2015/0042833 | A1 | 2/2015 | Lelescu et al. |
| 2015/0049915 | A1 | 2/2015 | Ciurea et al. |
| 2015/0049916 | A1 | 2/2015 | Ciurea et al. |
| 2015/0049917 | A1 | 2/2015 | Ciurea et al. |
| 2015/0055884 | A1 | 2/2015 | Venkataraman et al. |
| 2015/0091900 | A1 | 4/2015 | Yang et al. |
| 2015/0122411 | A1 | 5/2015 | Rodda et al. |
| 2015/0124113 | A1 | 5/2015 | Rodda et al. |
| 2015/0124151 | A1 | 5/2015 | Rodda et al. |

FOREIGN PATENT DOCUMENTS

| | | | |
|---|---|---|---|
| EP | 1201407 | A2 | 5/2002 |
| EP | 1734766 | A2 | 12/2006 |
| EP | 2104334 | A1 | 9/2009 |
| EP | 2336816 | A2 | 6/2011 |
| JP | 59025483 | | 9/1984 |
| JP | 64037177 | | 7/1989 |
| JP | 02285772 | A | 11/1990 |
| JP | 11142609 | A | 5/1999 |
| JP | 11223708 | A | 8/1999 |
| JP | 2000209503 | A | 7/2000 |
| JP | 2002205310 | A | 7/2002 |
| JP | 2002252338 | A | 9/2002 |
| JP | 2003094445 | A | 4/2003 |
| JP | 2003163938 | A | 6/2003 |
| JP | 2004221585 | A | 8/2004 |
| JP | 2005116022 | A | 4/2005 |
| JP | 2005181460 | A | 7/2005 |
| JP | 2005295381 | A | 10/2005 |
| JP | 2006033493 | A | 2/2006 |
| JP | 2006047944 | A | 2/2006 |
| JP | 2006258930 | A | 9/2006 |
| JP | 2007520107 | A | 7/2007 |
| JP | 2008055908 | A | 3/2008 |
| JP | 2008507874 | A | 3/2008 |
| JP | 2008258885 | A | 10/2008 |
| JP | 2009132010 | A | 6/2009 |
| JP | 2011109484 | A | 6/2011 |
| JP | 2013526801 | A | 6/2013 |
| JP | 2014521117 | A | 8/2014 |
| KR | 1020110097647 | A | 8/2011 |
| WO | 2007083579 | A1 | 7/2007 |
| WO | 2008108271 | A1 | 9/2008 |
| WO | 2008108926 | A1 | 9/2008 |

(56) References Cited

FOREIGN PATENT DOCUMENTS

| | | | |
|---|---|---|---|
| WO | 2008150817 | A1 | 12/2008 |
| WO | 2009151903 | A2 | 12/2009 |
| WO | 2011008443 | A2 | 1/2011 |
| WO | 2011055655 | A1 | 5/2011 |
| WO | 2011063347 | A2 | 5/2011 |
| WO | 2011/116203 | A1 | 9/2011 |
| WO | 2011116203 | A1 | 9/2011 |
| WO | 2011/063347 | A3 | 10/2011 |
| WO | 2011143501 | A1 | 11/2011 |
| WO | 2012057619 | A1 | 5/2012 |
| WO | 2012057620 | A2 | 5/2012 |
| WO | 2012057621 | A1 | 5/2012 |
| WO | 2012057622 | A1 | 5/2012 |
| WO | 2012057623 | A1 | 5/2012 |
| WO | 2012057620 | A3 | 6/2012 |
| WO | 2012074361 | A1 | 6/2012 |
| WO | 2012078126 | A1 | 6/2012 |
| WO | 2012082904 | A1 | 6/2012 |
| WO | 2012155119 | A1 | 11/2012 |
| WO | 2013003276 | A1 | 1/2013 |
| WO | 2013043751 | A1 | 3/2013 |
| WO | 2013043761 | A1 | 3/2013 |
| WO | 2013049699 | A1 | 4/2013 |
| WO | 2013055960 | A1 | 4/2013 |
| WO | 2013119706 | A1 | 8/2013 |
| WO | 2013126578 | A1 | 8/2013 |
| WO | 2014052974 | A2 | 4/2014 |
| WO | 2014032020 | A3 | 5/2014 |
| WO | 2014078443 | A1 | 5/2014 |
| WO | 2014130849 | A1 | 8/2014 |
| WO | 2014133974 | A1 | 9/2014 |
| WO | 2014138695 | A1 | 9/2014 |
| WO | 2014138697 | A1 | 9/2014 |
| WO | 2014144157 | A1 | 9/2014 |
| WO | 2014145856 | A1 | 9/2014 |
| WO | 2014149403 | A1 | 9/2014 |
| WO | 2014150856 | A1 | 9/2014 |
| WO | 2014159721 | A1 | 10/2014 |
| WO | 2014159779 | A1 | 10/2014 |
| WO | 2014160142 | A1 | 10/2014 |
| WO | 2014164550 | A2 | 10/2014 |
| WO | 2014164909 | A1 | 10/2014 |
| WO | 2014165244 | A1 | 10/2014 |
| WO | 2014133974 | A9 | 4/2015 |
| WO | 2015048694 | A2 | 4/2015 |

OTHER PUBLICATIONS

Fischer et al., Optical System Design, 2nd Edition, SPIE Press, 49-58.
Nomura et al., “Scene Collages and Flexible Camera Arrays”, Proceedings of Eurographics Symposium on Rendering, 2007, 12 pgs.
Rander et al., “Virtualized Reality: Constructing Time-Varying Virtual Worlds From Real World Events”, Proc. of IEEE Visualization ’97, Phoenix, Arizona, Oct. 19-24, 1997, pp. 277-283, 552.
Taylor, “Virtual camera movement: The way of the future?”, American Cinematographer 77, (Sep. 9), 93-100.
Yang et al., “A Real-Time Distributed Light Field Camera”, Eurographics Workshop on Rendering (2002), pp. 1-10.
Zhang et al., “A Self-Reconfigurable Camera Array”, Eurographics Symposium on Rendering, 2004, 12 pgs.
International Search Report and Written Opinion for International Application PCT/US2012/056151, completed Nov. 14, 2012, 10 pgs.
International Search Report and Written Opinion for International Application PCT/US2009/044687, completed Jan. 5, 2010, 13 pgs.
International Search Report and Written Opinion for International Application PCT/US2010/057661, completed Mar. 9, 2011, 14 pgs.
Bose et al., “Superresolution and Noise Filtering Using Moving Least Squares”, IEEE Transactions on Image Processing, date unknown, 21 pgs.
Bruckner et al., “Artificial compound eye applying hyperacuity”, Optics Express, Dec. 11, 2006, vol. 14, No. 25, pp. 12076-12084.
Bruckner et al., “Driving microoptical imaging systems towards miniature camera applications”, Proc. SPIE, Micro-Optics, 2010, 11 pgs.
Bruckner et al., “Thin wafer-level camera lenses inspired by insect compound eyes”, Optics Express, Nov. 22, 2010, vol. 18, No. 24, pp. 24379-24394.
Chan et al., “Extending the Depth of Field in a Compound-Eye Imaging System with Super-Resolution Reconstruction”, Proceedings—International Conference on Pattern Recognition, 2006, vol. 3, pp. 623-626.
Chan et al., “Investigation of Computational Compound-Eye Imaging System with Super-Resolution Reconstruction”, IEEE, ISASSP 2006, pp. 1177-1180.
Chan et al., “Super-resolution reconstruction in a computational compound-eye imaging system”, Multidim. Syst. Sign Process, 2007, vol. 18, pp. 83-101.
Duparre et al., “Artificial apposition compound eye fabricated by micro-optics technology”, Applied Optics, Aug. 1, 2004, vol. 43, No. 22, pp. 4303-4310.
Duparre et al., “Artificial compound eye zoom camera”, Bioinspiration & Biomimetics, 2008, vol. 3, pp. 1-6.
Duparre et al., “Artificial compound eyes—different concepts and their application to ultra flat image acquisition sensors”, MOEMS and Miniaturized Systems IV, Proc. SPIE 5346, Jan. 2004, pp. 89-100.
Duparre et al., “Chirped arrays of refractive ellipsoidal microlenses for aberration correction under oblique incidence”, Optics Express, Dec. 26, 2005, vol. 13, No. 26, pp. 10539-10551.
Duparre et al., “Micro-optical artificial compound eyes”, Bioinspiration & Biomimetics, 2006, vol. 1, pp. R1-R16.
Duparre et al., “Microoptical artificial compound eyes—from design to experimental verification of two different concepts”, Proc. of SPIE, Optical Design and Engineering II, vol. 5962, pp. 59622A-1-59622A-12.
Duparre et al., “Microoptical Artificial Compound Eyes—Two Different Concepts for Compact Imaging Systems”, 11th Microoptics Conference, Oct. 30-Nov. 2, 2005, 2 pgs.
Duparre et al., “Microoptical telescope compound eye”, Optics Express, Feb. 7, 2005, vol. 13, No. 3, pp. 889-903.
Duparre et al., “Micro-optically fabricated artificial apposition compound eye”, Electronic Imaging—Science and Technology, Prod. SPIE 5301, Jan. 2004, pp. 25-33.
Duparre et al., “Novel Optics/Micro-Optics for Miniature Imaging Systems”, Proc. of SPIE, 2006, vol. 6196, pp. 619607-1-619607-15.
Duparre et al., “Theoretical analysis of an artificial superposition compound eye for application in ultra flat digital image acquisition devices”, Optical Systems Design, Proc. SPIE 5249, Sep. 2003, pp. 408-418.
Duparre et al., “Thin compound-eye camera”, Applied Optics, May 20, 3005, vol. 44, No. 15, pp. 2949-2956.
Duparre et al., “Ultra-Thin Camera Based on Artificial Apposistion Compound Eyes”, 10th Microoptics Conference, Sep. 1-3, 2004, 2 pgs.
Farrell et al., “Resolution and Light Sensitivity Tradeoff with Pixel Size”, Proceedings of the SPIE Electronic Imaging 2006 Conference, 2006, vol. 6069, 8 pgs.
Fife et al., “A 3D Multi-Aperture Image Sensor Architecture”, Custom Integrated Circuits Conference, 2006, CICC ’06, IEEE, pp. 281-284.
Fife et al., “A 3MPixel Multi-Aperture Image Sensor with 0.7Mu Pixels in 0.11Mu CMOS”, ISSCC 2008, Session 2, Image Sensors & Technology, 2008, pp. 48-50.
Hardie, “A Fast Image Super-Algorithm Using an Adaptive Wiener Filter”, IEEE Transactions on Image Processing, Dec. 2007, vol. 16, No. 12, pp. 2953-2964.
Horisaki et al., “Irregular Lens Arrangement Design to Improve Imaging Performance of Compound-Eye Imaging Systems”, Applied Physics Express, 2010, vol. 3, pp. 022501-1-022501-3.
Horisaki et al., “Superposition Imaging for Three-Dimensionally Space-Invariant Point Spread Functions”, Applied Physics Express, 2011, vol. 4, pp. 112501-1-112501-3.
Kitamura et al., “Reconstruction of a high-resolution image on a compound-eye image-capturing system”, Applied Optics, Mar. 10, 2004, vol. 43, No. 8, pp. 1719-1727.

(56) References Cited

OTHER PUBLICATIONS

Lensvector, "How LensVector Autofocus Works", http://www.lensvector.com/overview.html.
Levoy, "Light Fields and Computational Imaging", IEEE Computer Society, Aug. 2006, pp. 46-55.
Levoy et al., "Light Field Rendering", Proc. ADM SIGGRAPH '96, pp. 1-12.
Nayar, "Computational Cameras: Redefining the Image", IEEE Computer Society, Aug. 2006, pp. 30-38.
Ng, "Digital Light Field Photography", Thesis, Jul. 2006, 203 pgs.
Nitta et al., "Image reconstruction for thin observation module by bound optics by using the iterative backprojection method", Applied Optics, May 1, 2006, vol. 45, No. 13, pp. 2893-2900.
Pham et al., "Robust Super-Resolution without Regularization", Journal of Physics: Conference Series 124, 2008, pp. 1-19.
Polight, "Designing Imaging Products Using Reflowable Autofocus Lenses", http://www.polight.no/tunable-polymer-autofocus-lens-html—11.html.
Protter et al., "Generalizing the Nonlocal-Means to Super-Resolution Reconstruction", IEEE Transactions on Image Processing, Jan. 2009, vol. 18, No. 1, pp. 36-51.
Radtke et al., "Laser lithographic fabrication and characterization of a spherical artificial compound eye", Optics Express, Mar. 19, 2007, vol. 15, No. 6, pp. 3067-3077.
Stollberg et al., "The Gabor superlens as an alternative wafer-level camera approach inspired by superposition compound eyes of nocturnal insects", Optics Express, Aug. 31, 2009, vol. 17, No. 18, pp. 15747-15759.
Sun et al., "Image Super-Resolution Using Gradient Profile Prior", Source and date unknown, 8 pgs.
Takeda et al., "Super-resolution Without Explicit Subpixel Motion Estimation", IEEE Transaction on Image Processing, Sep. 2009, vol. 18, No. 9, pp. 1958-1975.
Tanida et al., "Color imaging with an integrated compound imaging system", Optics Express, Sep. 8, 2003, vol. 11, No. 18, pp. 2109-2117.
Tanida et al., "Thin observation module by bound optics (TOMBO): concept and experimental verification", Applied Optics, Apr. 10, 2001, vol. 40, No. 11, pp. 1806-1813.
Vaish et al., "Reconstructing Occluded Surfaces Using Synthetic Apertures: Stereo, Focus and Robust Measures", Proceeding, CVPR '06 Proceedings of the 2006 IEEE Computer Society Conference on Computer Vision and Pattern Recognition—vol. 2, pp. 2331-2338.
Vaish et al., "Synthetic Aperture Focusing Using a Shear-Warp Factorization of the Viewing Transform", IEEE Workshop on A3DISS, CVPR, 2005, 8 pgs.
Vaish et al., "Using Plane + Parallax for Calibrating Dense Camera Arrays", IEEE Conference on Computer Vision and Pattern Recognition (CVPR), 2004, 8 pgs.
Wang, Yuhao "Calculation of Image Position, Size and Orientation Using First Order Properties".
Wetzstein et al., "Computational Plenoptic Imaging", Computer Graphics Forum, 2011, vol. 30, No. 8, pp. 2397-2426.
Wikipedia, "Polarizing Filter (Photography)".
Wilburn, "High Performance Imaging Using Arrays of Inexpensive Cameras", Thesis of Bennett Wilburn, Dec. 2004, 128 pgs.
Wilburn et al., "High Performance Imaging Using Large Camera Arrays", ACM Transactions on Graphics, Jul. 2005, vol. 24, No. 3, pp. 765-776.
Wilburn et al., "High-Speed Videography Using a Dense Camera Array", Proceeding, CVPR'04 Proceedings of the 2004 IEEE Computer Society Conference on Computer Vision and Pattern Recognition, pp. 294-301.
Wilburn et al., "The Light Field Video Camera", Proceedings of Media Processors 2002, SPIE Electronic Imaging, 2002, 8 pgs.
Wippermann et al., "Design and fabrication of a chirped array of refractive ellipsoidal micro-lenses for an apposition eye camera objective", Proceedings of SPIE, Optical Design and Engineering II, Oct. 15, 2005, 59622C-1-59622C-11.
Yang et al., "Superresolution Using Preconditioned Conjugate Gradient Method", Source and date unknown, 8 pgs.
Zomet et al., "Robust Super-Resolution", IEEE, 2001, pp. 1-6.
International Search Report and Written Opinion for International Application No. PCT/US13/46002, Search Completed Nov. 13, 2013, Mailed Nov. 29, 2013, 7 pgs.
International Search Report and Written Opinion for International Application No. PCT/US13/48772, Search Completed Oct. 21, 2013, Mailed Nov. 8, 2013, 6 pgs.
International Search Report and Written Opinion for International Application No. PCT/US13/56065, Search Completed Nov. 25, 2013, Mailed Nov. 26, 2013, 8 pgs.
International Search Report and Written Opinion for International Application No. PCT/US13/59991, Search Completed Feb. 6, 2014, Mailed Feb. 26, 2014, 8 pgs.
International Search Report and Written Opinion for International Application No. PCT/US2013/024987, Search Completed Mar. 27, 2013, Mailed Apr. 15, 2013, 14 pgs.
International Search Report and Written Opinion for International Application No. PCT/US2013/056502, Search Completed Feb. 18, 2014, Mailed Mar. 19, 2014, 7 pgs.
International Search Report and Written Opinion for International Application No. PCT/US2013/069932, International Filing Date Nov. 13, 2013, Search Completed Mar. 14, 2014, Mailed Apr. 14, 2014, 12 pgs.
IPRP for International Application No. PCT/US2012/059813, International Filing Date Oct. 11, 2012, Search Completed Apr. 15, 2014, 7 pgs.
International Search Report and Written Opinion for International Application PCT/US11/36349, mailed Aug. 22, 2011, 12 pgs.
International Search Report and Written Opinion for International Application No. PCT/US2011/64921, Report Completed Feb. 25, 2011, mailed Mar. 6, 2012, 17 pgs.
International Search Report and Written Opinion for International Application No. PCT/US2013/027146, completed Apr. 2, 2013, 12 pgs.
International Search Report and Written Opinion for International Application PCT/US2012/044014, completed Oct. 12, 2012, 15 pgs.
International Search Report and Written Opinion for International Application PCT/US2012/059813, completed Dec. 17, 2012, 8 pgs.
International Search Report and Written Opinion for International Application PCT/US12/37670, Mailed Jul. 18, 2012, Search Completed Jul. 5, 2012, 9 pgs.
International Search Report and Written Opinion for International Application PCT/US2012/58093, completed Nov. 15, 2012, 12 pgs.
Office Action for U.S. Appl. No. 12/952,106, dated Aug. 16, 2012, 12 pgs.
Baker et al., "Limits on Super-Resolution and How to Break Them", IEEE Transactions on Pattern Analysis and Machine Intelligence, Sep. 2002, vol. 24, No. 9, pp. 1167-1183.
Bertero et al., "Super-resolution in computational imaging", Micron, 2003, vol. 34, Issues 6-7, 17 pgs.
Bishop et al., "Full-Resolution Depth Map Estimation from an Aliased Plenoptic Light Field", ACCV 2010, Part II, LNCS 6493, pp. 186-200, 2011.
Bishop et al., "Light Field Superresolution", Retrieved from http://home.eps.hw.ac.uk/~sz73/ICCP09/LightFieldSuperresolution.pdf, 9 pgs.
Bishop et al., "The Light Field Camera: Extended Depth of Field, Aliasing, and Superresolution", IEEE Transactions on Pattern Analysis and Machine Intelligence, May 2012, vol. 34, No. 5, pp. 972-986.
Borman, "Topics in Multiframe Superresolution Restoration", Thesis of Sean Borman, Apr. 2004, 282 pgs.
Borman et al, "Image Sequence Processing", Source unknown, Oct. 14, 2002, 81 pgs.
Borman et al., "Block-Matching Sub-Pixel Motion Estimation from Noisy, Under-Sampled Frames—An Empirical Performance Evaluation", Proc SPIE, Dec. 1998, 3653, 10 pgs.
Borman et al., "Image Resampling and Constraint Formulation for Multi-Frame Super-Resolution Restoration", Proc. SPIE, Jun. 2003, 5016, 12 pgs.

(56) References Cited

OTHER PUBLICATIONS

Borman et al., “Linear models for multi-frame super-resolution restoration under non-affine registration and spatially varying PSF”, Proc. SPIE, May 2004, vol. 5299, 12 pgs.
Borman et al., “Nonlinear Prediction Methods for Estimation of Clique Weighting Parameters in NonGaussian Image Models”, Proc. SPIE, 1998. 3459, 9 pgs.
Borman et al., “Simultaneous Multi-Frame MAP Super-Resolution Video Enhancement Using Spatio-Temporal Priors”, Image Processing, 1999, ICIP 99 Proceedings, vol. 3, pp. 469-473.
Borman et al., “Super-Resolution from Image Sequences—A Review”, Circuits & Systems, 1998, pp. 374-378.
Boye et al., “Comparison of Subpixel Image Registration Algorithms”, Proc. of SPIE-IS&T Electronic Imaging, vol. 7246, pp. 72460X-1-72460X-9.
Capel, “Image Mosaicing and Super-resolution”, [online], Retrieved on Nov. 10, 2012. Retrieved from the Internet at URL:<http://citeseerx.ist.psu.edu/viewdoc/download?doi=10.1.1.226.2643 &rep=rep1 &type=pdf>, Title pg., abstract, table of contents, pp. 1-263 (269 total pages), 2001.
Drouin et al., “Fast Multiple-Baseline Stereo with Occlusion”, Proceedings of the Fifth International Conference on 3-D Digital Imaging and Modeling, 2005, 8 pgs.
Drouin et al., “Geo-Consistency for Wide Multi-Camera Stereo”, Proceedings of the 2005 IEEE Computer Society Conference on Computer Vision and Pattern Recognition, 2005, 8 pgs.
Drouin et al., “Improving Border Localization of Multi-Baseline Stereo Using Border-Cut”, International Journal of Computer Vision, Jul. 2009, vol. 83, Issue 3, 8 pgs.
Fanaswala, “Regularized Super-Resolution of Multi-View Images”, Retrieved on Nov. 10, 2012. Retrieved from the Internet at URL:<http://www.site.uottawa.ca/-edubois/theses/Fanaswala_thesis.pdf>, 163 pgs., Aug. 2009.
Farsiu et al., “Advances and Challenges in Super-Resolution”, International Journal of Imaging Systems and Technology, 2004, vol. 14, pp. 47-57.
Farsiu et al., “Fast and Robust Multiframe Super Resolution”, IEEE Transactions on Image Processing, Oct. 2004, vol. 13, No. 10, pp. 1327-1344.
Farsiu et al., “Multiframe Demosaicing and Super-Resolution of Color Images”, IEEE Transactions on Image Processing, Jan. 2006, vol. 15, No. 1, pp. 141-159.
Feris et al., “Multi-Flash Stereopsis: Depth Edge Preserving Stereo with Small Baseline Illumination”, IEEE Trans on PAMI, 2006, 31 pgs.
Hamilton, “JPEG File Interchange Format, Version 1.02”, Sep. 1, 1992, 9 pgs.
Kang et al., “Handling Occlusions inn Dense Multi-View Stereo”, Computer Vision and Pattern Recognition, 2001, vol. 1, pp. I-103-I-110.
Krishnamurthy et al., “Compression and Transmission of Depth Maps for Image-Based Rendering”, Image Processing, 2001, pp. 828-831.
Kutulakos et al., “Occluding Contour Detection Using Affine Invariants and Purposive Viewpoint Control”, Proc., CVPR 94, 8 pgs.
Li et al., “A Hybrid Camera for Motion Deblurring and Depth Map Super-Resolution,” Jun. 23-28, 2008, IEEE Conference on Computer Vision and Pattern Recognition, 8 pgs. Retrieved from www.eecis.udel.edu/~jye/lab_research/08/deblur-feng.pdf on Feb. 5, 2014.
Liu et al., “Virtual View Reconstruction Using Temporal Information”, 2012 IEEE International Conference on Multimedia and Expo, 2012, pp. 115-120.
Muehlebach, “Camera Auto Exposure Control for VSLAM Applications”, Studies on Mechatronics.
Ng et al., “Super-Resolution Image Restoration from Blurred Low-Resolution Images”, Journal of Mathematical Imaging and Vision, 2005, vol. 23, pp. 367-378.
Park et al., “Super-Resolution Image Reconstruction”, IEEE Signal Processing Magazine, May 2003, pp. 21-36.
Rhemann et al, “Fast Cost-Volume Filtering for Visual Correspondence and Beyond”, IEEE Trans. Pattern Anal. Mach. Intell, 2013, vol. 35, No. 2, pp. 504-511.
Robertson et al., “Dynamic Range Improvement Through Multiple Exposures”, In Proc. of the Int. Conf. on Image Processing, 1999, 5 pgs.
Robertson et al., “Estimation-theoretic approach to dynamic range enhancement using multiple exposures”, Journal of Electronic Imaging, Apr. 2003, vol. 12, No. 2, pp. 219-228.
Roy et al., “Non-Uniform Hierarchical Pyramid Stereo for Large Images”, Computer and Robot Vision, 2007, pp. 208-215.
Sauer et al., “Parallel Computation of Sequential Pixel Updates in Statistical Tomographic Reconstruction”, ICIP 1995, pp. 93-96.
Shum et al., “Pop-Up Light Field: An Interactive Image-Based Modeling and Rendering System,” Apr. 2004, ACM Transactions on Graphics, vol. 23, No. 2, pp. 143-162. Retrieved from http://131.107.65.14/en-us/um/people/jiansun/papers/PopupLightField_TOG.pdf on Feb. 5.
Vuong et al., “A New Auto Exposure and Auto White-Balance Algorithm to Detect High Dynamic Range Conditions Using CMOS Technology”.
Wheeler et al., “Super-Resolution Image Synthesis Using Projections Onto Convex Sets in the Frequency Domain”, Proc. SPIE, 2005, 5674, 12 pgs.
Fischer, et al., Optical System Design, 2nd Edition, SPIE Press, pp. 191-198.
Fischer, et al., “Optical System Design, 2nd Edition, SPIE Press, pp. 49-58”.
Rander, et al., “Virtualized Reality: Constructing Time-Varying Virtual Worlds From Real World Events”, Proc. of IEEE Visualization ’97, Phoenix, Arizona, Oct. 19-24, 1997, pp. 277-283, 552.
Taylor, Dayton, “Virtual camera movement: The way of the future?”, American Cinematographer 77, (Sep. 9), 93-100.
Yang, Jason C. et al., “A Real-Time Distributed Light Field Camera”, Eurographics Workshop on Rendering (2002), pp. 1-10.
Zhang, Cha et al., “A Self-Reconfigurable Camera Array”, Eurographics Symposium on Rendering, 2004, 12 pgs.
International Preliminary Report on Patentability for International Application PCT/US2013/027146,Report Completed Apr. 2, 2013, Mailed Sep. 4, 2014, 10 Pages.
International Search Report and Written Opinion for International Application PCT/US13/62720, report completed Mar. 25, 2014, Mailed Apr. 21, 2014, 9 Pgs.
International Search Report and Written Opinion for International Application PCT/US14/17766, completed May 28, 2014, Mailed Jun. 18, 2014, 9 pgs.
International Search Report and Written Opinion for International Application PCT/US14/24407, report completed Jun. 11, 2014, Mailed Jul. 8, 2014, 9 Pgs.
International Search Report and Written Opinion for International Application PCT/US14/25100, report completed Jul. 7, 2014, Mailed Aug. 7, 2014 5 Pgs.
International Search Report and Written Opinion for International Application PCT/US2014/022123, report completed Jun. 9, 2014, Mailed Jun. 25, 2014, 5 pgs.
International Search Report and Written Opinion for International Application PCT/US2014/028447, report completed Jun. 30, 2014, Mailed Jul. 21, 2014, 8 Pgs.
International Search Report and Written Opinion for International Application PCT/US2014/030692, report completed Jul. 28, 2014, Mailed Aug. 27, 2014, 7 Pages.
International Search Report and Written Opinion for International Application PCT/US2014/23762, Report Completed May 30, 2014, Mailed Jul. 3, 2014, 6 Pgs.
International Search Report and Written Opinion for International Application PCT/US14/18084, completed May 23, 2014, Mailed Jun. 10, 2014, 12 pgs.
International Search Report and Written Opinion for International Application PCT/US14/18116, report completed May 13, 2014, Mailed Jun. 2, 2014, 6 Pgs.
International Search Report and Written Opinion for International Application PCT/US14/22118, report completed Jun. 9, 2014, Mailed, Jun. 25, 2014, 5 pgs.

(56) References Cited

OTHER PUBLICATIONS

Chen et al., "Interactive deformation of light fields", In Proceedings of SIGGRAPH I3D 2005, pp. 139-146.
Goldman et al.,"Video Object Annotation, Navigation, and Composition", In Proceedings of UIST 2008, pp. 3-12.
Gortler et al., The Lumigraph, In Proceedings of SIGGRAPH 1996, pp. 43-54.
Hacohen et al., Non-Rigid Dense Correspondence with Applications for Image Enhancement, ACM Transactions on Graphics, 30, 4, 2011, pp. 70:1-70:10.
Hasinoff et al., Search-and-Replace Editing for Personal Photo Collections, Computational Photography (ICCP) 2010, pp. 1-8.
Horn et al., "LightShop: Interactive Light Field Manipulation and Rendering", In Proceedings of I3D 2007, pp. 121-128.
Isaksen et al., "Dynamically Reparameterized Light Fields", In Proceedings of SIGGRAPH 2000, pp. 297-306.
Jarabo et al., "Efficient Propagation of Light Field Edits", In Proceedings of SIACG 2011, pp. 75-80.
Joshi et al., "Synthetic Aperture Tracking: Tracking Through Occlusions", ICCV IEEE 11th International Conference on Computer Vision; Publication [online]. Oct. 2007 [retrieved Jul. 28, 2014]. Retrieved from the Internet: <URL:http:l/ieeexplore.ieee.org/stamp/stamp.jsp?tp=&arnumber=4409032&isnumber=4408819>; pp. 1-8.
Lo et al., "Stereoscopic 3D Copy & Paste", ACM Transactions on Graphics, vol. 29, No. 6, Article 147, Dec. 2010, pp. 147:1-147:10.
Seitz et al., "Plenoptic Image Editing", International Journal of Computer Vision 48, 2, pp. 115-129.
Veilleux, "CCD Gain Lab: The Theory", University of Maryland, College Park—Observational Astronomy (ASTR 310), Oct. 19, 2006, pp. 1-5 (online], [retrieved on May 13, 2014]. Retrieved from the Internet <URL:http://www.astro.umd.edu/~veilleux/ASTR310/fall06/ccd_theory.pdf, 5 pgs.
US 8,964,053, 02/2015, Venkataraman et al. (withdrawn).
US 8,965,058, 02/2015, Venkataraman et al. (withdrawn).
International Search Report and Written Opinion for International Application PCT/US14/17766, report completed May 28, 2014, 9 Pgs.
International Preliminary Report on Patentability for International Application PCT/US2013/048772, report completed Oct. 21, 2013, Mailed Jan. 8, 2015, 8 Pgs.
International Preliminary Report on Patentability for International Application PCT/US2013/039155, report completed Nov. 4, 2014, Mailed Nov. 13, 2014, 10 Pgs.
Extended European Search Report for European Application EP12804266.0, Report Completed Jan. 27, 2015, Mailed Feb. 3, 2015, 6 Pgs.
Extended European Search Report for European Application EP12835041.0, Report Completed Jan. 28, 2015, Mailed Feb. 4, 2015, 6 Pgs.
Zhang, Qiang et al., "Depth estimation, spatially variant image registration, and super-resolution using a multi-lenslet camera", Proceedings of SPIE, vol. 7705, Apr. 23, 2010, pp. 770505-770505-8, XP055113797 ISSN: 0277-786X, DOI: 10.1117/12.852171, Apr. 23, 2010.
International Search Report and Written Opinion for International Application PCT/US2014/064693, Report Completed Mar. 7, 2015, Mailed Apr. 2, 2015, 15 pgs.
International Preliminary Report on Patentability for International Application No. PCT/US2013/059991, Report Issued Mar. 17, 2015, Mailed Mar. 26, 2015, 8 pgs.
International Preliminary Report on Patentability for International Application No. PCT/US2013/062720, Report Issued Mar. 31, 2015, Mailed Apr. 9, 2015, 8 Pgs.
International Preliminary Report on Patentability for International Application No. PCT/US2014/023762, Report issued Mar. 2, 2015, Mailed Mar. 9, 2015, 10 Pgs.
International Search Report and Written Opinion for International Application No. PCT/US2014/066229, Search Completed Mar. 6, 2015, Mailed Mar. 19, 2015, 9 Pgs.
International Preliminary Report on Patentability for International Application No. PCT/US2013/056065, Report Issued Feb. 24, 2015, Mailed Mar. 5, 2015, 4 Pgs.
International Preliminary Report on Patentability for International Application No. PCT/US2013/056502, Report Issued Feb. 24, 2015, Mailed Mar. 5, 2015, 7 Pgs.
International Search Report and Written Opinion for International Application No. PCT/US2013/039155, Search completed Jul. 1, 2013, Mailed Jul. 11, 2013, 11 Pgs.
Mitra et al., "Light Field Denoising, Light Field Superresolution and Stereo Camera Based Refocussing using a GMM Light Field Patch Prior", Computer Vision and Pattern Recognition Workshops (CVPRW), 2012 IEEE Computer Society Conference on Jun. 16-21, 2012, pp. 22-28.
Extended European Search Report for European Application EP12782935.6, report completed Aug. 28, 2014 Mailed Sep. 4, 2014, 6 Pgs.
International Preliminary Report on Patentability for International Application No. PCT/US2013/024987, Mailed Aug 21, 2014, 13 Pgs.
International Preliminary Report on Patentability for International Application No. PCT/US2013/046002, Report issued Dec. 31, 2014, Mailed Jan. 8, 2015, 6 Pgs.
International Preliminary Report on Patentability for International Application No. PCT/US2013/069932, Report issued May 19, 2015, Mailed May 28, 2015, 12 Pgs.
International Search Report and Written Opinion for International Application No. PCT/US2014/024903 report completed Jun. 12, 2014, Mailed, Jun. 27, 2014, 13 pgs.
International Search Report and Written Opinion for International Application No. PCT/US2014/022774 report completed Jun. 9, 2014, Mailed Jul. 14, 2014, 6 Pgs.
International Search Report and Written Opinion for International Application No. PCT/US2014/025904, report completed Jun. 10, 2014, Mailed Jul. 10, 2014, 6 Pgs.
International Search Report and Written Opinion for International Application No. PCT/US2014/024947, Report Completed Jul. 8, 2014, Mailed Aug. 5, 2014, 8 Pgs.
International Search Report and Written Opinion for International Application No. PCT/US2014/067740, Report Completed Jan. 29, 2015, Mailed Mar. 3 2015, 10 pgs.
Chen et al., "KNN Matting", IEEE Transactions on Pattern Analysis and Machine Intelligence, Sep. 2013, vol. 35, No. 9, pp. 2175-2188.
Lai et al., "A Large-Scale Hierarchical Multi-View RGB-D Object Dataset", source and date unknown, 8 pgs.
Lee et al., "Electroactive Polymer Actuator for Lens-Drive Unit in Auto-Focus Compact Camera Module", ETRI Journal, vol. 31, No. 6, Dec. 2009, pp. 695-702.
Levin et al., "A Closed Form Solution to Natural Image Matting", Pattern Analysis and Machine Intelligence, Feb. 2008, vol. 30, 8 pgs.
Moreno-Noguer, Francese et al., "Active Refocusing of Images and Videos", ACM SIGGRAPH, 2007, vol. 26, pp. 1-10, [retrieved on Jul. 8, 2015], Retrieved from the Internet <URL:http://doi.acm.org/10.1145/1276377.1276461>.
Perwass et al., "Single Lens 3D-Camera with Extended Depth-of-Field", printed from www.raytrix.de, 15 pgs.
Pouydebasquea et al., "Varifocal liquid lenses with integrated actuator, high focusing power and low operating voltage fabricated on 200 mm wafers", Sensors and Actuators A: Physical, vol. 172, Issue 1, Dec. 2011, pp. 280-286.
Tallon et al., "Upsampling and Denoising of Depth Maps Via Joint-Segmentation", 20th European Signal Processing Conference, Aug. 27-31, 2012, 5 pgs.
US 9,014,491, 04/2015, Venkataraman et al. (withdrawn)

* cited by examiner

| $G_1$ | $R_1$ | $G_4$ | | |
|---|---|---|---|---|
| $B_1$ | $G_3$ | $B_2$ | | |
| $G_2$ | $R_2$ | $G_5$ | | |
| | | | | |
| | | | | |

| $G_1$ | $R_1$ | $G_4$ | | |
|---|---|---|---|---|
| $B_1$ | $G_3$ | $B_2$ | $G_7$ | |
| $G_2$ | $R_2$ | $G_5$ | $R_3$ | |
| | $G_6$ | $B_3$ | $G_8$ | |
| | | | | |

| $G_1$ | $R_1$ | $G_5$ | | |
|---|---|---|---|---|
| $B_1$ | $G_3$ | $B_2$ | $G_7$ | |
| $G_2$ | $R_2$ | $G_6$ | $R_3$ | $G_{10}$ |
| | $G_4$ | $B_3$ | $G_8$ | $B_4$ |
| | | $G_9$ | $R_4$ | $G_{11}$ |

| $G_1$ | $R_1$ | $G_5$ | $R_6$ | $G_{13}$ |
|---|---|---|---|---|
| $B_1$ | $G_3$ | $B_2$ | $G_7$ | $B_6$ |
| $G_2$ | $R_2$ | $G_6$ | $R_3$ | $G_{10}$ |
| $B_5$ | $G_4$ | $B_3$ | $G_8$ | $B_4$ |
| $G_{12}$ | $R_5$ | $G_9$ | $R_4$ | $G_{11}$ |

CAMERA MODULES PATTERNED WITH PI FILTER GROUPS

CROSS-REFERENCE TO RELATED APPLICATIONS

The current application claims priority to U.S. Provisional Application No. 61/641,165, filed on May 1, 2012, the disclosure of which is incorporated herein by reference.

FIELD OF THE INVENTION

The present invention relates generally to digital cameras and more specifically to filter patterns utilized in camera modules of array cameras.

BACKGROUND OF THE INVENTION

Conventional digital cameras typically include a single focal plane with a lens stack. The focal plane includes an array of light sensitive pixels and is part of a sensor. The lens stack creates an optical channel that forms an image of a scene upon the array of light sensitive pixels in the focal plane. Each light sensitive pixel can generate image data based upon the light incident upon the pixel.

In a conventional color digital camera, an array of color filters is typically applied to the pixels in the focal plane of the camera's sensor. Typical color filters can include red, green and blue color filters. A demosaicing algorithm can be used to interpolate a set of complete red, green and blue values for each pixel of image data captured by the focal plane given a specific color filter pattern. One example of a camera color filter pattern is the Bayer filter pattern. The Bayer filter pattern describes a specific pattern of red, green and blue color filters that results in 50% of the pixels in a focal plane capturing green light, 25% capturing red light and 25% capturing blue light.

SUMMARY OF THE INVENTION

Systems and methods in accordance with embodiments of the invention pattern array camera modules with π filter groups. In one embodiment, an array camera module includes: an M×N imager array including a plurality of focal planes, each focal plane including an array of light sensitive pixels; an M×N optic array of lens stacks, where each lens stack corresponds to a focal plane, and where each lens stack forms an image of a scene on its corresponding focal plane; where each pairing of a lens stack and its corresponding focal plane thereby defines a camera; where at least one row in the M×N array of cameras includes at least one red color camera, at least one green color camera, and at least one blue color camera; and where at least one column in the M×N array of cameras includes at least one red color camera, at least one green color camera, and at least one blue color camera.

In another embodiment, M and N are each greater than two and at least one of M and N is even; color filters are implemented within the cameras in the array camera module such that the array camera module is patterned with at least one π filter group including: a 3×3 array of cameras including: a reference camera at the center of the 3×3 array of cameras; two red color cameras located on opposite sides of the 3×3 array of cameras; two blue color cameras located on opposite sides of the 3×3 array of cameras; and four green color cameras surrounding the reference camera.

In yet another embodiment, each of the four green color cameras surrounding the reference camera is disposed at a corner location of the 3×3 array of cameras.

In still another embodiment, M is four; N is four; the first row of cameras of the 4×4array camera module includes, in the following order, a green color camera, a blue color camera, a green color camera, and a red color camera; the second row of cameras of the 4×4 array camera module includes, in the following order, a red color camera, a green color camera, a red color camera, and a green color camera; the third row of cameras of the 4×4 array camera module includes, in the following order, a green color camera, a blue color camera, a green color camera, and a blue color camera; and the fourth row of cameras of the 4×4 array camera module includes, in the following order, a blue color camera, a green color camera, a red color camera, and a green color camera.

In an even further embodiment, M is four; N is four; the first row of cameras of the 4×4 array camera module includes, in the following order, a red color camera, a green color camera, a blue color camera, and a green color camera; the second row of cameras of the 4×4 array camera module includes, in the following order a green color camera, a red color camera, a green color camera, and a red color camera; the third row of cameras of the 4×4 array camera module includes, in the following order, a blue color camera, a green color camera, a blue color camera, and a green color camera; and the fourth row of cameras of the 4×4 array camera module includes, in the following order, a green color camera, a red color camera, a green color camera, and a blue color camera.

In still another embodiment, the reference camera is a green color camera.

In still yet another embodiment, the reference camera is one of: a camera that incorporates a Bayer filter, a camera that is configured to capture infrared light, and a camera that is configured to capture ultraviolet light.

In a still yet further embodiment, each of the two red color cameras is located at a corner location of the 3×3 array of cameras, and each of the two blue color cameras is located at a corner location of the 3×3 array of cameras.

In another embodiment, at least one color filter is implemented on the imager array.

In a further embodiment, at least one color filter is implemented on a lens stack.

In another embodiment, a 3×3 array camera module includes: a 3×3 imager array including a 3×3 arrangement of focal planes, each focal plane including an array of light sensitive pixels; a 3×3 optic array of lens stacks, where each lens stack corresponds to a focal plane, and where each lens stack forms an image of a scene on its corresponding focal plane; where each pairing of a lens stack and its corresponding focal plane thereby defines a camera; where the 3×3 array of cameras includes: a reference camera at the center of the 3×3 array of cameras; two red color cameras located on opposite sides of the 3×3 array of cameras; two blue color cameras located on opposite sides of the 3×3 array of cameras; and four green color cameras, each located at a corner location of the 3×3 array of cameras; where each of the color cameras is achieved using a color filter.

In a further embodiment, at least one color filter is implemented on the imager array to achieve a color camera.

In a still yet further embodiment, at least one color filter is implemented within a lens stack to achieve a color camera.

In yet another embodiment, the reference camera is a green color camera.

In an even further embodiment, the reference camera is one of: a camera that incorporates a Bayer filter, a camera that is configured to capture infrared light, and a camera that is configured to capture ultraviolet light.

In another embodiment, a method of patterning an array camera module with at least one π filter group includes: evaluating whether an imager array of M×N focal planes, where each focal plane comprises an array of light sensitive pixels, includes any defective focal planes; assembling an M×N array camera module using: the imager array of M×N focal planes; an M×N optic array of lens stacks, where each lens stack corresponds with a focal plane, where the M×N array camera module is assembled so that: each lens stack and its corresponding focal plane define a camera; color filters are implemented within the array camera module such that the array camera module is patterned with at least one π filter group including: a 3×3 array of cameras including: a reference camera at the center of the 3×3 array of cameras; two red color cameras located on opposite sides of the 3×3 array of cameras; two blue color cameras located on opposite sides of the 3×3 array of cameras; and four green color cameras surrounding the reference camera; and where the array camera module is patterned with the at least one π filter group such that a camera that includes a defective focal plane is a green color camera.

In a further embodiment, at least one color filter is implemented on the imager array.

In a still further embodiment, at least one color filter is implemented within a lens stack.

In an even further embodiment, the reference camera is a green color camera.

In still yet another embodiment, the reference camera is one of: a camera that incorporates a Bayer filter, a camera that is configured to capture infrared light, and a camera that is configured to capture ultraviolet light.

DETAILED DESCRIPTION

Figure 1:
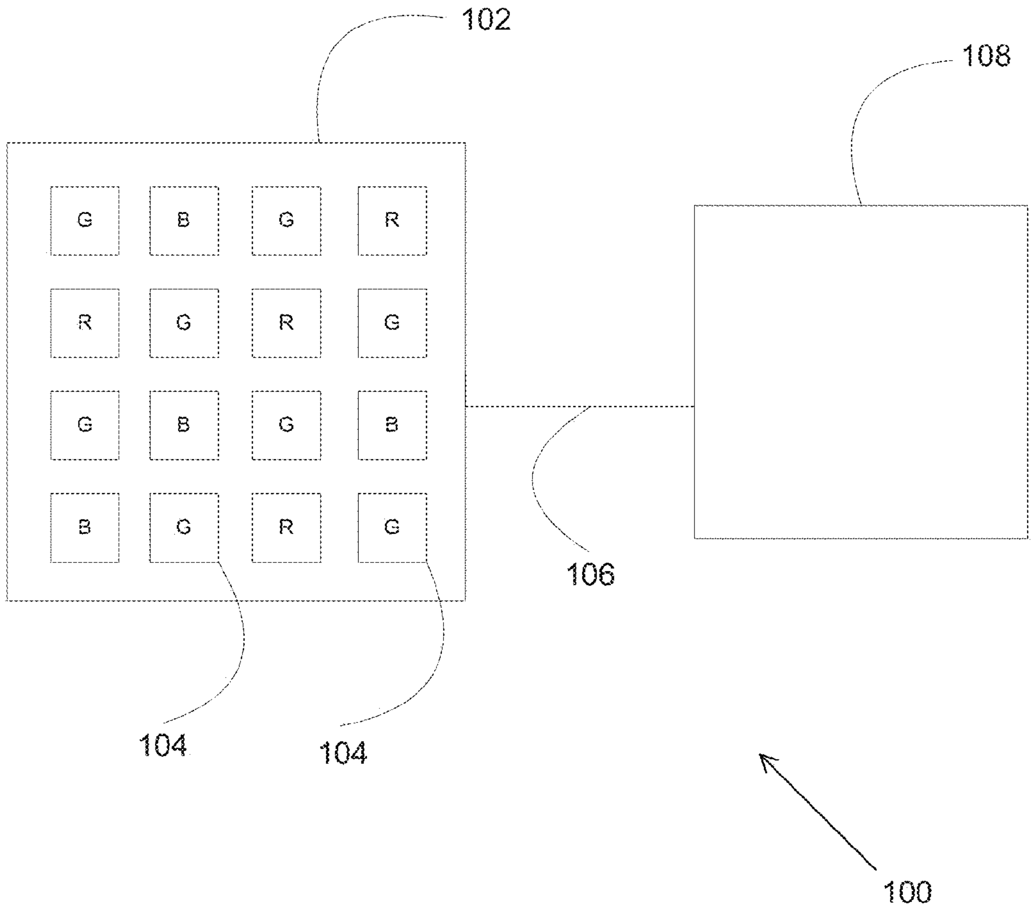
FIG. 1 illustrates an array camera with a camera module and processor in accordance with an embodiment of the invention.

Turning now to the drawings, systems and methods for patterning array cameras with π filter groups in accordance with embodiments of the invention are illustrated. In many embodiments, camera modules of an array camera are patterned with one or more π filter groups. The term patterned here refers to the use of specific color filters in individual cameras within the camera module so that the cameras form a pattern of color channels within the array camera. The term color channel or color camera can be used to refer to a camera that captures image data within a specific portion of the spectrum and is not necessarily limited to image data with respect to a specific color. The term Bayer camera can be used to refer to a camera that captures image data using the Bayer filter pattern on the image plane. In many embodiments, a color channel can include a camera that captures infrared light, ultraviolet light, extended color and any other portion of the visible spectrum appropriate to a specific application. The term π filter group refers to a 3×3 group of cameras including a central camera and color cameras distributed around the central camera to minimize occlusion zones. The central camera of a π filter group can be used as a reference camera when synthesizing an image using image data captured by an imager array. A camera is a reference camera when its viewpoint is used as the viewpoint of the synthesized image. The central camera of a π filter group is surrounded by color cameras in a way that minimizes occlusion zones for each color camera when the central camera is used as a reference camera. Occlusion zones are areas surrounding foreground objects not visible to cameras that are spatially offset from the reference camera due to the effects of parallax. In several embodiments, the central camera is a green camera while in other embodiments the central camera captures image data from any appropriate portion of the spectrum. In a number of embodiments, the central camera is a Bayer camera (i.e. a camera that utilizes a Bayer filter pattern to capture a color image). In many embodiments, a π filter group is a 3×3 array of cameras with a green color camera at each corner and a green color camera at the center which can serve as the reference camera with a symmetrical distribution of red and blue cameras around the central green camera. The symmetrical distribution can include arrangements where either red color cameras are directly above and below the center green reference camera with blue color cameras directly to the left and right, or blue color cameras directly above and below the green center reference camera with red color cameras directly to the left and right.

Camera modules of dimensions greater than a 3×3 array of cameras can be patterned with π filter groups in accordance with many embodiments of the invention. In many embodiments, patterning a camera module with π filter groups enables an efficient distribution of cameras around a reference camera that reduces occlusion zones. In several embodiments, patterns of π filter groups can overlap with each other such that two overlapping π filter groups on a camera module share common cameras. When overlapping π filter groups do not span all of the cameras in the camera module, cameras that are not part of a π filter group can be assigned a color to minimize occlusion zones in the resulting camera array.

In several embodiments, patterning a camera module with π filter groups can result in reference cameras that are not in the center of the camera module. Additionally, color cameras surrounding the reference camera need not be uniformly distributed but need only be distributed in a way to minimize occlusion zones of each color from the perspective of the reference camera. Utilization of a reference camera in a π filter group to synthesize an image from captured image data can be significantly less computationally intensive than synthesizing an image using the same image data from a virtual viewpoint.

High quality images or video can be captured by an array camera including a camera module patterned with π filter groups utilizing a subset of cameras within the camera module (i.e. not requiring that all cameras on a camera module be utilized). Similar techniques can also be used for efficient generation of stereoscopic 3D images utilizing image data captured by subsets of the cameras within the camera module.

Patterning camera modules with π filter groups also enables robust fault tolerance in camera modules with multiple π filter groups as multiple possible reference cameras can be utilized if a reference camera begins to perform sub optimally. Patterning camera modules with π filter groups also allows for yield improvement in manufacturing camera modules as the impact of a defective focal plane on a focal plane array can be minimized by simply changing the pattern of the color lens stacks in an optic array. Various π filter groups and the patterning of camera modules with π filter groups in accordance with embodiments of the invention are discussed further below.

Array Cameras

In many embodiments, an array camera includes a camera module and a processor. An array camera with a camera module patterned with π filter groups in accordance with an embodiment of the invention is illustrated in FIG. 1. The array camera 100 includes a camera module 102 as an array of individual cameras 104 where each camera 104 includes a focal plane with a corresponding lens stack. An array of individual cameras refers to a plurality of cameras in a particular arrangement, such as (but not limited to) the square arrangement utilized in the illustrated embodiment. The camera module 102 is connected 106 to a processor 108. In the illustrated embodiment, a camera 104 labeled as "R" refers to a red camera with a red filtered color channel, "G" refers to a green camera with a green filtered color channel and "B" refers to a blue camera with a blue filtered color channel. Although a specific array camera is illustrated in FIG. 1, any of a variety of different array camera configurations can be utilized in accordance with many different embodiments of the invention.

Camera Modules

Figure 2:
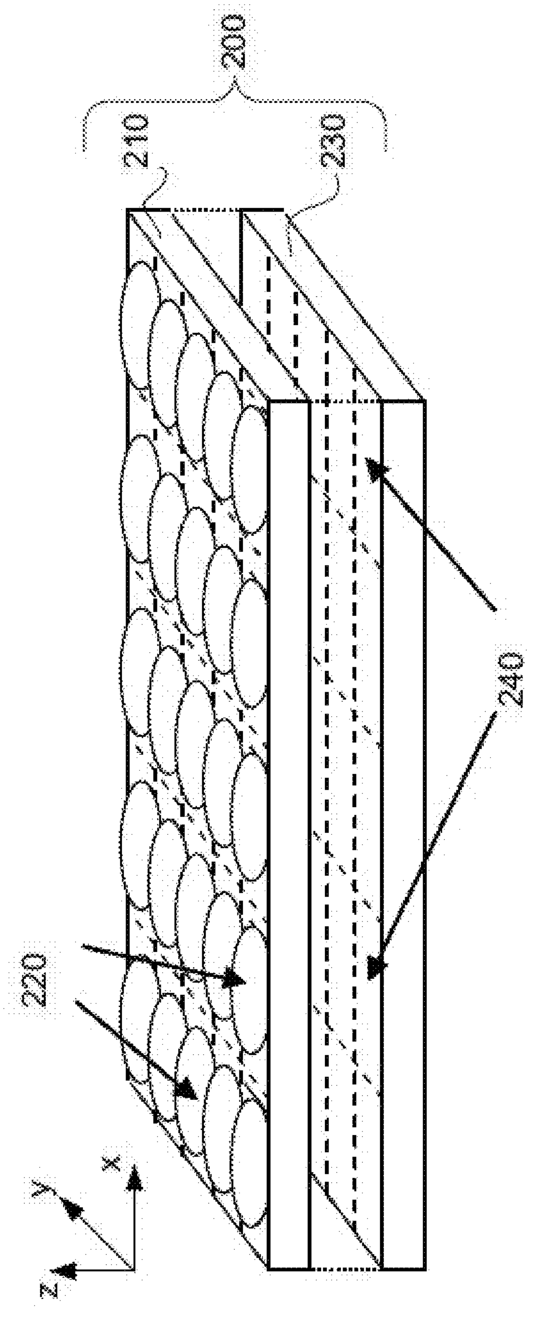
FIG. 2 illustrates a camera module with an optic array and imager array in accordance with an embodiment of the invention.

Camera modules in accordance with embodiments of the invention can be constructed from an imager array and an optic array. A camera module in accordance with an embodiment of the invention is illustrated in FIG. 2. The camera module 200 includes an imager array 230 including an array of focal planes 240 along with a corresponding optic array 210 including an array of lens stacks 220. Within the array of lens stacks, each lens stack 220 creates an optical channel that forms an image of a scene on an array of light sensitive pixels within a corresponding focal plane 240. Each pairing of a lens stack 220 and focal plane 240 forms a single camera 104 within the camera module. Each pixel within a focal plane 240 of a camera 104 generates image data that can be sent from the camera 104 to the processor 108.

In several embodiments, color filters in individual cameras can be used to pattern the camera module with π filter groups. These cameras can be used to capture data with respect to different colors, or a specific portion of the spectrum. In contrast to applying color filters to the pixels of the camera, color filters in many embodiments of the invention are included in the lens stack. For example, a green color camera can include a lens stack with a green light filter that allows green light to pass through the optical channel. In many embodiments, the pixels in each focal plane are the same and the light information captured by the pixels is differentiated by the color filters in the corresponding lens stack for each filter plane. Although a specific construction of a camera module with an optic array including color filters in the lens stacks is described above, camera modules including π filter groups can be implemented in a variety of ways including (but not limited to) by applying color filters to the pixels of the focal planes of the camera module similar to the manner in which color filters are applied to the pixels of a conventional color camera. In several embodiments, at least one of the cameras in the camera module can include uniform color filters applied to the pixels in its focal plane. In many embodiments, a Bayer filter pattern is applied to the pixels of one of the cameras in a camera module. In a number of embodiments, camera modules are constructed in which color filters are utilized in both the lens stacks and on the pixels of the imager array.

In several embodiments, an array camera generates image data from the multiple focal planes and uses a processor to synthesize one or more images of a scene. In certain embodiments, the image data captured by a single focal plane in the sensor array can constitute a low resolution image (the term low resolution here is used only to contrast with higher resolution images), which the processor can use in combination with other low resolution image data captured by the camera module to construct a higher resolution image through Super Resolution processing. Super Resolution processes that can be used to synthesize high resolution images using low resolution images captured by an array camera are discussed in U.S. patent application Ser. No. 12/967,807 entitled "Systems and Methods for Synthesizing High Resolution Images Using Super-Resolution Processes", filed Dec. 14, 2010, the disclosure of which is hereby incorporated by reference in its entirety.

Although specific array cameras are discussed above, many different array cameras are capable of utilizing π filter groups in accordance with embodiments of the invention. Camera modules utilizing π filter groups in accordance with embodiments of the invention are described in further detail below.

Patterning with π Filter Groups

Camera modules can be patterned with π filter groups in accordance with embodiments of the invention. In several embodiments, π filter groups utilized as part of a camera module can each include a central camera that can function as a reference camera surrounded by color cameras in a way that reduces occlusion zones for each color. In certain embodiments, the camera module is arranged in a rectangular format utilizing the RGB color model where a reference camera is a green camera surrounded by red, green and blue cameras. In several embodiments, a number of green cameras that is twice the number of red cameras and twice the number of blue cameras surround the reference camera. However, any set of colors from any color model can be utilized to detect a useful range of colors in addition to the RGB color model, such as the cyan, magenta, yellow and key (CMYK) color model or red, yellow and blue (RYB) color model.

Figure 3A:
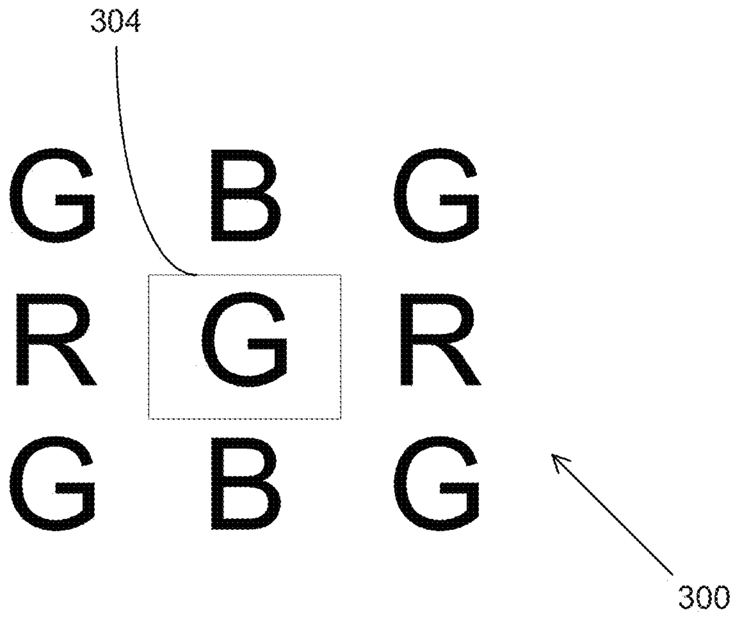
FIG. 3A conceptually illustrates a 3×3 camera module patterned with a π filter group where red cameras are arranged horizontally and blue cameras are arranged vertically in accordance with an embodiment of the invention.

In several embodiments, two π filter groups can be utilized in the patterning of a camera module when the RGB color model is used. One π filter group is illustrated in FIG. 3A and the other π filter group is illustrated FIG. 3B. Either of these π filter groups can be used to pattern any camera module with dimensions greater than a 3×3 array of cameras.

Figure 3B:
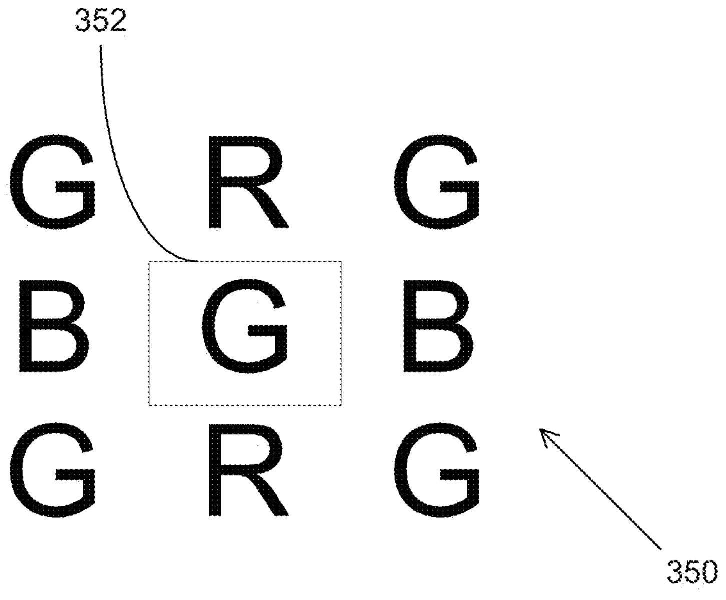
FIG. 3B conceptually illustrates a 3×3 camera module patterned with a π filter group where red cameras are arranged vertically and blue cameras are arranged horizontally in accordance with an embodiment of the invention.

In embodiments with a 3×3 camera module, patterning of the camera module with π filter group includes only a single π filter group. A π filter group on a 3×3 camera module in accordance with an embodiment of the invention is illustrated in FIG. 3A. The π filter group 300 includes a green camera at each corner, a green reference camera in the center notated within a box 304, blue cameras above and below the reference camera, and red cameras to the left and right sides of the reference camera. In this configuration, the number of green cameras surrounding the central reference camera is twice the number of red cameras and twice the number of blue cameras. An alternative to the π filter group described in FIG. 3A is illustrated in FIG. 3B in accordance with an embodiment of the invention. This π filter group also includes green cameras at the corners with a green reference camera 352 at the center, as denoted with a box. However, unlike FIG. 3A, the red cameras shown in FIG. 3B are above and below, and the blue cameras are to the left and right side of the reference camera. As with the π filter group shown in FIG. 3A, the π filter group in FIG. 3B includes a central reference camera surrounded by a number of green cameras that is twice the number of red cameras and twice the number of blue cameras. As discussed above, the reference camera need not be a green camera. In several embodiments, the configurations in FIGS. 3A and 3B can be modified to include a central camera that employs a Bayer color filter. In other embodiments, the central camera is an infrared camera, an extended color camera and/or any other type of camera appropriate to a specific application. In further embodiments, any of a variety of color cameras can be distributed around the reference camera in a manner that reduces occlusion zones with respect to each color channel.

Figure 4:
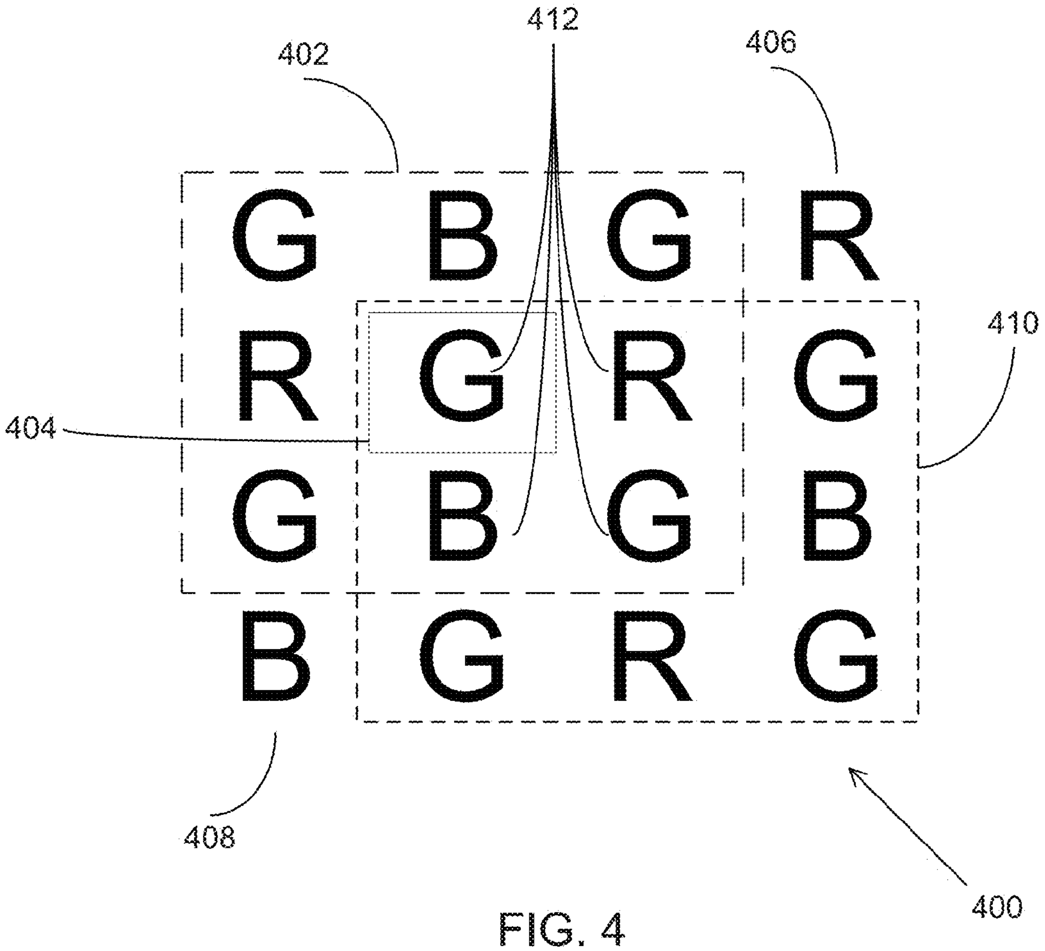
FIG. 4 conceptually illustrates a 4×4 camera module patterned with two π filter groups in accordance with an embodiment of the invention.

Any camera module with dimensions at and above 3×3 cameras can be patterned with one or more π filter groups, where cameras not within a π filter group are assigned a color that reduces or minimizes the likelihood of occlusion zones within the camera module given color filter assignments of the π filter groups. A 4×4 camera module patterned with two π filter groups in accordance with an embodiment of the invention is illustrated in FIG. 4. The camera module 400 includes a first π filter group 402 of nine cameras centered on a reference green camera 404. A second π filter group 410 is diagonally located one camera shift to the lower right of the first π filter group. The second π filter group shares the four center cameras 412 of the camera module 400 with the first π filter group. However, the cameras serve different roles (i.e. different cameras act as reference cameras in the two π filter groups). As illustrated in FIG. 4, the two cameras at the corners 406 and 408 of the camera module are not included in the two π filter groups, 402 and 410. The color filters utilized within these cameras are determined based upon minimization of occlusion zones given the color filter assignments of the cameras that are part of the two π filter groups, 402 and 410. Due to the patterning of the π filter groups, there is an even distribution of blue color cameras around the reference camera, but there is no red color camera above the reference camera. Therefore, selecting the upper right corner camera 406 to be red provides red image data from a viewpoint above the reference camera and the likelihood of occlusion zones above and to the right of the foreground images in a scene for the reference camera 404 and the center camera of the second π filter group is minimized. Similarly, selecting the lower left corner camera 408 to be blue provides blue image data from a viewpoint to the left of the reference camera and the likelihood of occlusion zones below and to the left of the foreground images in a scene for the reference camera 404 and the center camera of the second π filter group is minimized. Thereby, a camera module with dimensions greater than 3×3 can be patterned with π filter groups with colors assigned to cameras not included in any π filter group to reduce and/or minimize occlusion zones as discussed above. Although specific π filter groups are discussed above, any of a variety of π filter groups can pattern a camera module in accordance with many different embodiments of the invention.

Multiple Reference Camera Options with Equivalent Performance

Figure 5:
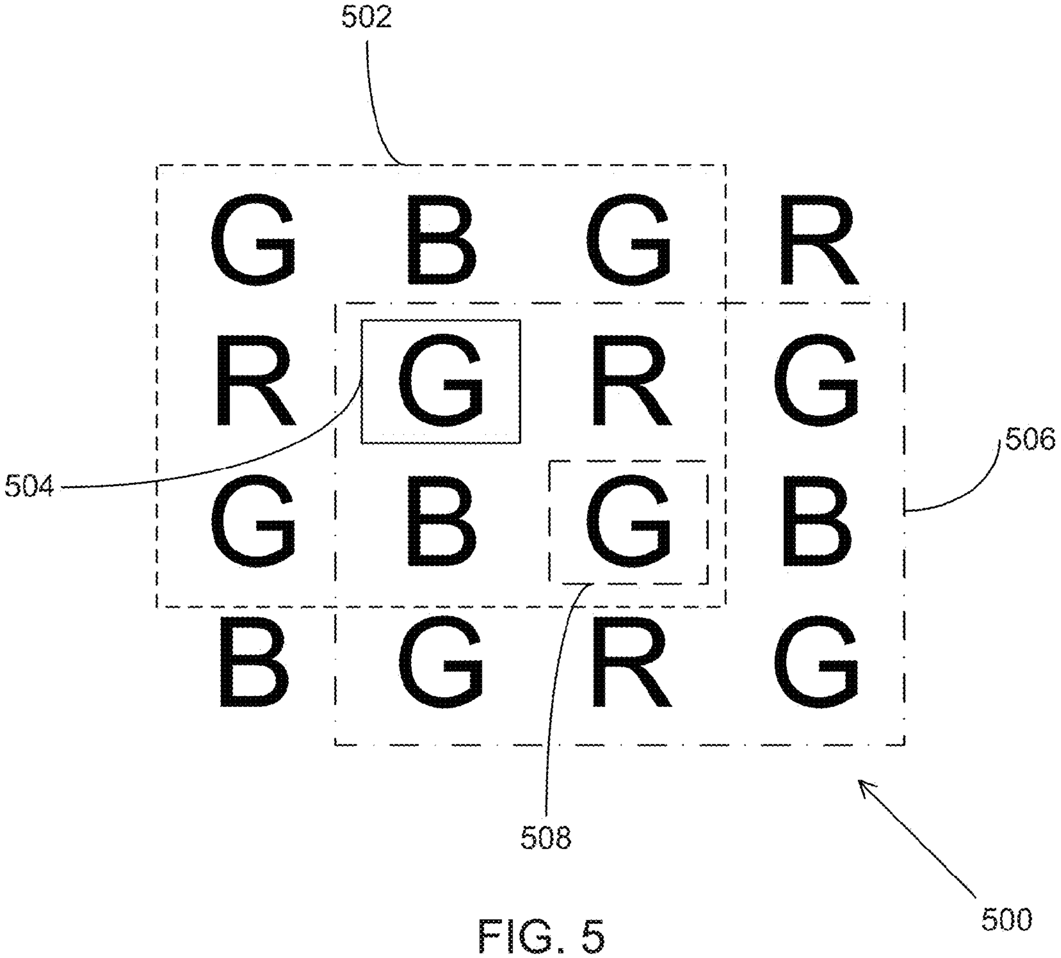
FIG. 5 conceptually illustrates a 4×4 camera module patterned with two π filter groups with two cameras that could each act as a reference camera in accordance with an embodiment of the invention.

The use of multiple π filter groups to pattern a camera module in accordance with embodiments of the invention enables multiple cameras to be used as the reference camera with equivalent performance. A 4×4 camera module with two π filter groups in accordance with an embodiment of the invention is illustrated in FIG. 5. The camera module 500 includes two π filter groups 502, 506 where the central camera of each π filter group 504, 508 can act as a reference camera. Irrespective of the reference camera that is selected, the distribution of cameras around the reference camera is equivalent due to the use of π filter groups. Thereby, if a camera module 500 detects a defect with the a reference camera 504, the camera module 500 can switch to using the camera at the center of another π filter group as a reference camera 508 to avoid the defects of the first reference camera 504. Furthermore, patterning with π filter groups does not require that the reference camera or a virtual viewpoint be at the center of a camera module but rather that the reference camera is surrounded by color cameras in a way that reduces occlusion zones for each color. Although a specific camera module is discussed above, camera modules of any number of different dimensions can be utilized to create multiple reference camera options in accordance with embodiments of the invention.

Manufacturing Yield Improvement

Manufacturing processes inherently involve variations that can result in defects. In some instances the manufacturing defects may be severe enough to render an entire focal plane within an imager array inoperable. If the failure of the focal plane results in the discarding of the imager array, then the cost to manufacture array cameras is increased. Patterning camera modules with π filter groups can provide high manufacturing yield because the allocation of color filters in the optical channels of the optic array can be used to reduce the impact that a faulty focal plane has with respect to the creation of occlusion zones in the images synthesized using the image data captured by the array camera.

In many embodiments, the light sensed by the pixels in a focal plane of an imager array is determined by a color filter included in the optical channel that focuses light onto the focal plane. During manufacture, defects in a focal plane can be detected. When a defect is detected, the color filter pattern of the optical channels in the optic array can be determined so that the defective focal plane does not result in an increase in the size of occlusion zones. Typically, this means patterning camera modules with π filter groups in such a way that the presence of the defective focal plane does not reduce the number of red or blue cameras in the camera array (i.e. a filter pattern is used that results in a green channel being assigned to the defective focal plane, which reduces the number of green cameras in the camera array by one camera).

Figure 6A:
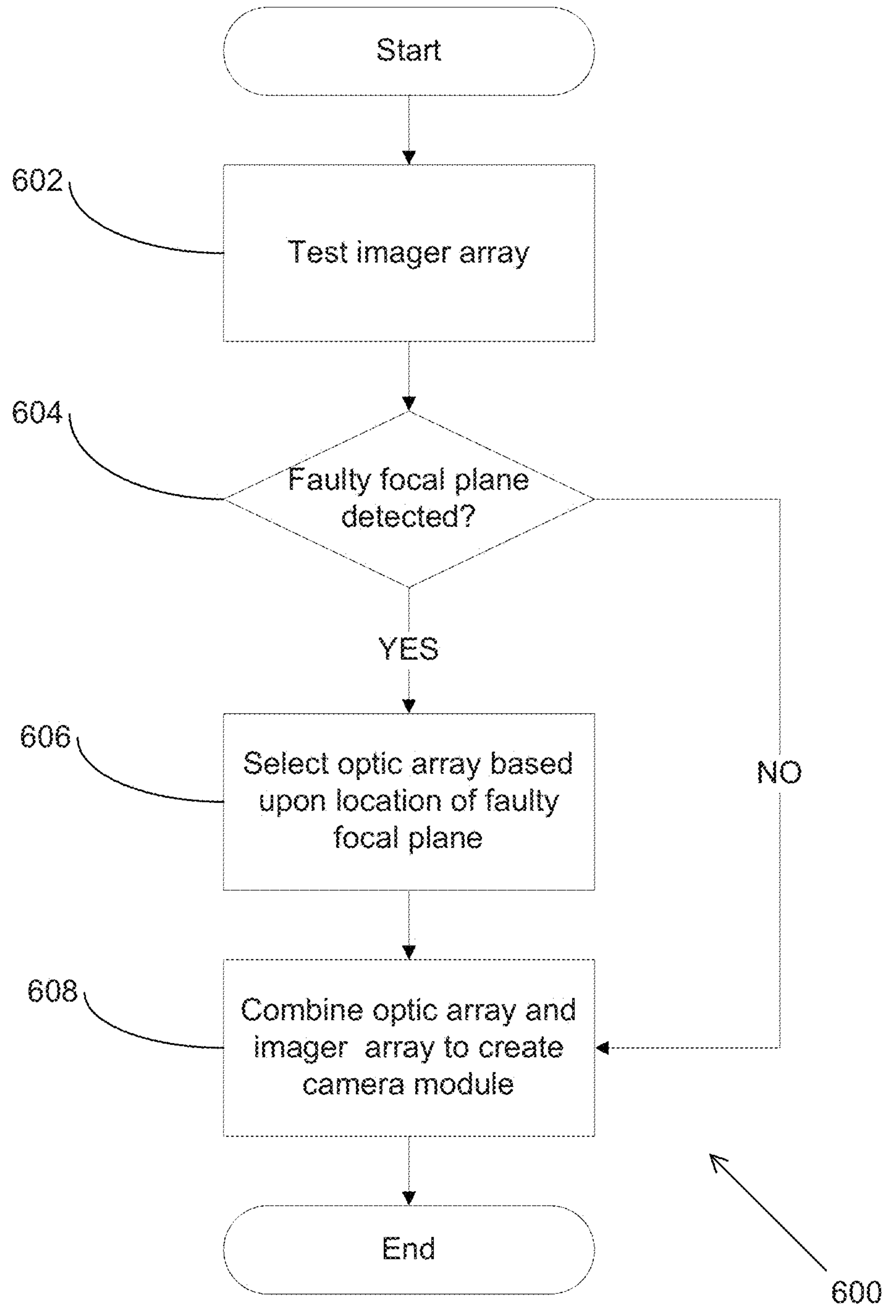
FIG. 6A illustrates a process for testing an imager array for defective focal planes to create a camera module that reduces the effect of any defective focal plane in accordance with an embodiment of the invention.

A process for detecting faulty focal planes before combining an optic array and imager array to create a camera module in accordance with embodiments of the invention is illustrated in FIG. 6A. In the illustrated process, the color filter patterns are patterned on the optics array and not on the pixels of the imager array. By manufacturing different types of optics arrays (with different filter patterns, a process can systematically choose a specific optics array to force the faulty focal plane to pair with a color of a certain filter to ensure that the size of the occlusion zones in a given color channel are reduced and/or minimized. The process 600 includes testing (602) an imager array for faulty focal planes. After testing (602) the imager array, a decision (604) is made as to whether a faulty focal plane is detected on the imager array. If a faulty focal plane is detected, then an optic array is selected based upon the location of the faulty focal plane (606). In many embodiments, an optic array is selected that reduces the effect of the faulty focal plane by assigning color filters to the operational focal planes in a way that minimizes the impact of the faulty focal plane on the creation of occlusion zones within images synthesized using image data captured by the imager array. Further discussion of selecting different optic arrays that reduce occlusion zones when there is a faulty focal plane is provided below with reference to FIGS. 6B and 6C. After selecting (606) an optic array based upon the location of the faulty focal plane, the selected optic array is combined (608) with the imager array to create a camera module. If a faulty focal plane is not detected, then any of a variety of optic arrays including filter patterns based on π filter groups can be combined (608) with the tested imager array to create a camera module. As is discussed further below, a typical process can include a default optic array including a first filter pattern based on π filter groups and a second filter pattern based on π filter groups can be utilized when specific defects are detected that would result in the faulty focal plane reducing the number of color cameras (or even specific color cameras such as color cameras around the outside of the camera module) in the camera module when the first filter pattern is used.

Figure 6B:
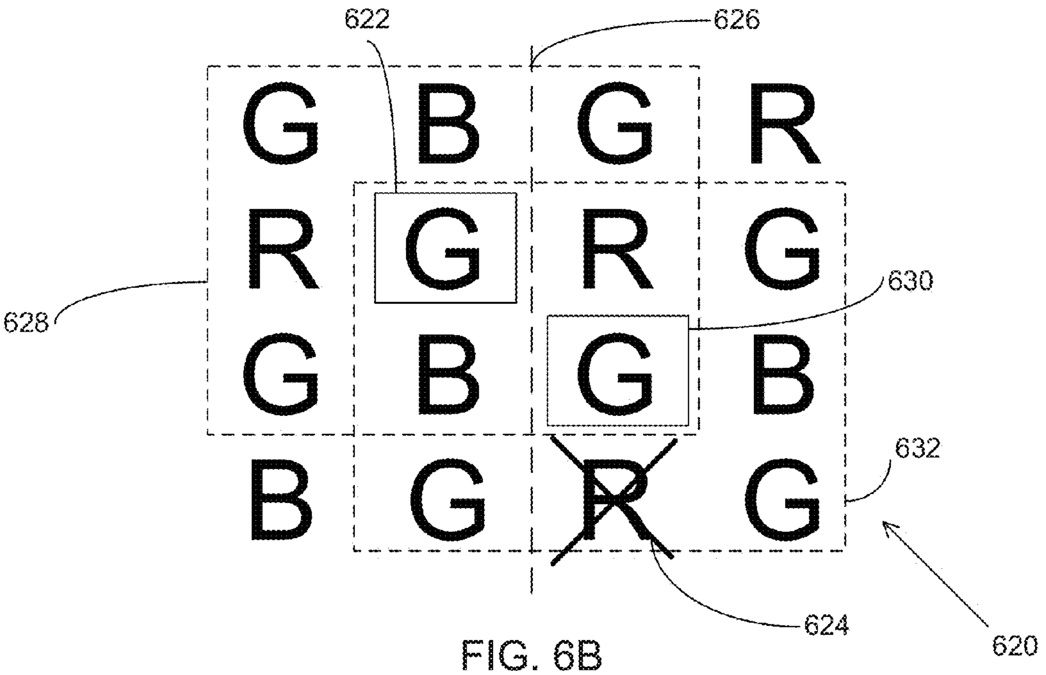
FIG. 6B conceptually illustrates a 4×4 camera module patterned with two π filter groups where a faulty focal plane causes a loss of red coverage around possible reference cameras.
Figure 6C:
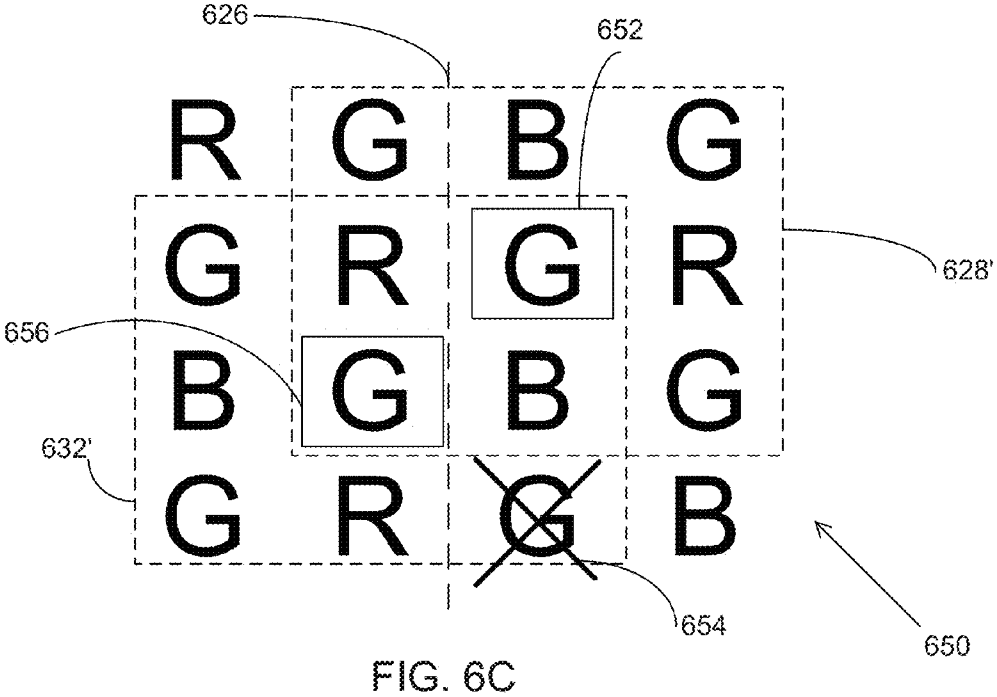
FIG. 6C conceptually illustrates the 4×4 camera module patterned with a different arrangement of π filter groups relative to FIG. 6B where the faulty focal plane does not result in a loss of red coverage around possible reference cameras in accordance with an embodiment of the invention.

The manner in which modifying color filter assignments can reduce the impact of a faulty focal plane is illustrated in FIGS. 6B and 6C. A camera module with a faulty red camera is illustrated in FIG. 6B. The camera module 620 includes a first π filter group 628 with a possible reference camera 622 at the center, a second π filter group 632 with a possible reference camera 630 at the center and a faulty red camera 624 below both π filter groups 628 and 632. There is a lack of red image data below both the possible reference cameras 622 and 630 due to the faulty red camera. Therefore, irrespective of which of the two cameras at the center of a π filter group is chosen as the reference camera. Accordingly, combining an optic array including the filter pattern illustrated in FIG. 6B to an imager with the indicated faulty focal plane results in a defective red camera that prevents the capture of red color information below any reference camera, increasing the likelihood of occlusion zones below foreground objects. However, an optic array patterned using π filter groups in different locations can result in all of the blue and red color filters being assigned to cameras that are active. In this way, the faulty focal plane only impacts the number of green cameras and does so in a way that reduces the likelihood of occlusion zones in an image synthesized using the image data captured by the resulting camera module. Stated another way, yield can be improved under certain circumstances by combining the imager array that includes the faulty focal plane with an optic array that assigns the color filters of the active cameras based on π filter groups in a way that results in color information being captured around the reference camera in a way that minimizes the likelihood of occlusion zones given the location of the faulty focal plane.

A camera module with the faulty focal plane of FIG. 6B but with an optic array patterned with π filter groups in such a way that the faulty focal plane does not reduce the capture of red or blue image data around the reference camera module is illustrated in FIG. 6C. Relative to the pattern of the optic array of FIG. 6B, the optic array of FIG. 6C is flipped along the center vertical bisecting axis 626 of the optic array and includes two π filter groups 628' and 632'. The lens stack associated with the faulty focal plane is green 654, as opposed to red 624 in FIG. 6B. As there are multiple green cameras below all possible reference cameras 652, 656 in FIG. 6C, the loss of a green camera 654 is less impactful as opposed to the impact from the loss of the red camera 624 in FIG. 6B. Therefore, the impact of faulty focal planes on an imager array can be reduced by combining the faulty imager array with an optic array specifically selected to assign color filters to the focal planes in the imager array in a manner that reduces the likelihood that the faulty focal plane will create an occlusion zone in any of the color channels captured by the resulting camera module. Although the example above discusses reducing red occlusion zones, the impact of a defective focal plane in any of the locations in an imager array can be similarly minimized by appropriate selection of a filter pattern based on π filter groups. Although specific examples of camera modules patterned with π filter groups to minimize yield loss due to faulty focal planes are described above, any of a variety of alternative color filter patterns including π filter groups can be utilized to increase manufacturing yield in accordance with embodiments of the invention.

Capturing Stereoscopic 3D Images

In many embodiments, Super Resolution processes can be used to synthesize high resolution images using low resolution images captured by an array camera including pairs of stereoscopic 3D images as disclosed in U.S. patent application Ser. No. 12/967,807 entitled "Systems and Methods for Synthesizing High Resolution Images Using Super-Resolution Processes", filed Dec. 14, 2010, the disclosure of which is incorporated by reference above. Stereoscopic 3D image pairs are two images of a scene from spatially offset viewpoints that can be combined to create a 3D representation of the scene. The use of a filter pattern including π filter groups can enable the synthesis of stereoscopic 3D images in a computationally efficient manner. Image data captured by less than all of the cameras in the array camera can be used to synthesize each of the images that form the stereoscopic 3D image pair.

Patterning with π filter groups enables an efficient distribution of cameras around a reference camera that reduces occlusion zones and reduces the amount of image data captured by the camera module that is utilized to synthesize each of the images in a stereoscopic 3D image pair. In many embodiments, different subsets of the cameras are used to capture each of the images that form the stereoscopic 3D image pair and each of the subsets includes a π filter group. In many embodiments, the images that form the stereoscopic 3D image pair are captured from a virtual viewpoint that is slightly offset from the camera at the center of the π filter group. The central camera of a π filter group is surrounded by color cameras in a way that minimizes occlusion zones for each color camera when the central camera is used as a reference camera. When the virtual viewpoint is proximate the center of a π filter group, the benefits of the distribution of color cameras around the virtual viewpoint are similar.

Figure 7B:
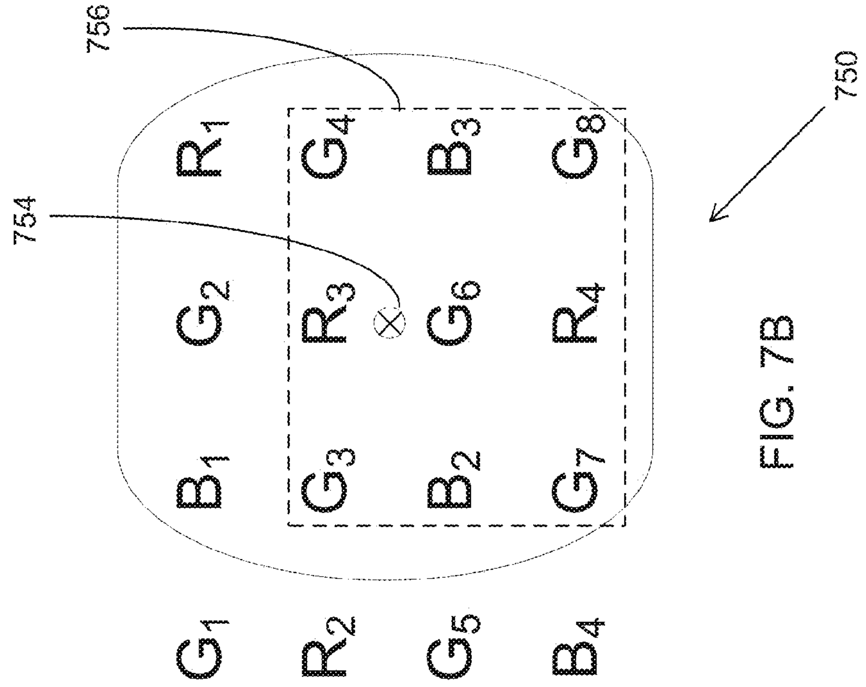
FIG. 7B conceptually illustrates use of a subset of cameras to produce a right virtual viewpoint for an array camera operating in 3D mode on a 4×4 camera module patterned with π filter groups in accordance with an embodiment of the invention.
Figure 7A:
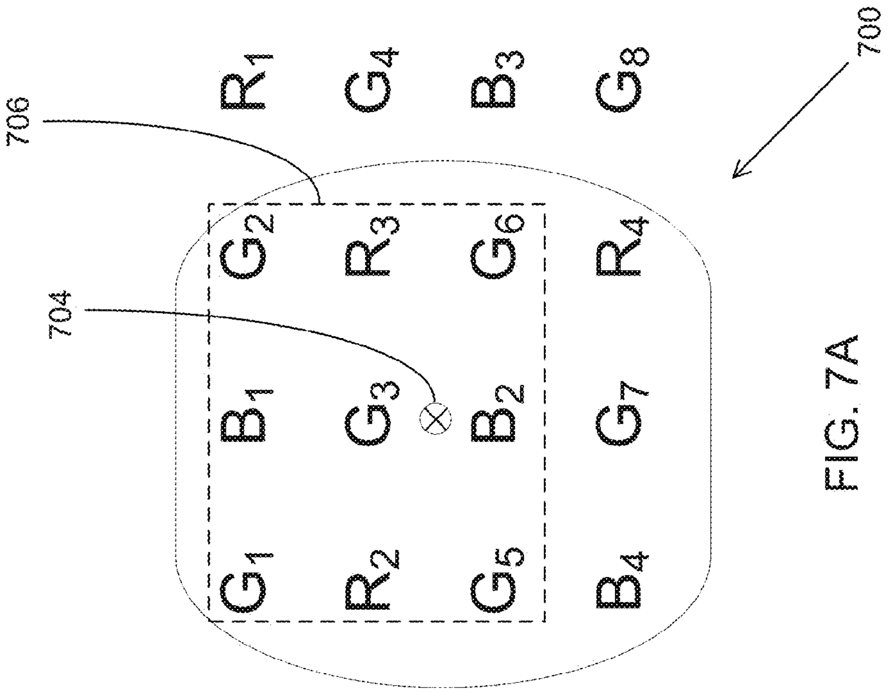
FIG. 7A conceptually illustrates use of a subset of cameras to produce a left virtual viewpoint for an array camera operating in 3D mode on a 4×4 camera module patterned with π filter groups in accordance with an embodiment of the invention.

A left virtual viewpoint for a stereoscopic 3D image pair captured using a camera module patterned using π filter groups is illustrated in FIG. 7A. The left virtual viewpoint 704 is taken from image data from the 12 circled cameras $G_1$-$G_3$, $G_5$-$G_7$, $B_1$-$B_2$, $B_4$, and $R_2$-$R_3$ that form a 3×4 array. The virtual viewpoint is offset relative to the green camera $G_3$, which is the center of a π filter group 706. A right virtual viewpoint used to capture the second image in the stereoscopic pair using the camera module shown in FIG. 5A is illustrated in FIG. 7B. The right virtual viewpoint 754 is taken from image data from the 12 circled cameras $B_1$-$B_3$, $G_2$-$G_4$, $G_6$-$G_8$, $R_1$, $R_3$-$R_4$ that form a 3×4 array. The virtual viewpoint is offset relative to the green camera $G_6$, which is the center of a π filter group 756. Therefore, a single array camera can capture 3D images of a scene using image data from a subset of the cameras to synthesize each of the images that form the stereoscopic pair. By utilizing the image data captured by less than all of the cameras in the camera module, the computational complexity of generating the stereoscopic 3D image pair is reduced. In addition, the location of the view points of each of the images proximate a camera that is the center of a π filter group reduces the likelihood of occlusion zones in the synthesized images.

Although specific viewpoints and subsets of cameras for synthesizing stereoscopic 3D image pairs are illustrated in FIGS. 7A and 7B, stereoscopic image pairs can be generated using subsets of cameras in any of a variety of camera modules in accordance with embodiments of the invention.

Capturing Images Using a Subset of Cameras

Array cameras with camera modules patterned with π filter groups can utilize less than all of the available cameras in operation in accordance with many embodiments of the invention. In several embodiments, using fewer cameras can minimize the computational complexity of generating an image using an array camera and can reduce the power consumption of the array camera. Reducing the number of cameras used to capture image data can be useful for applications such as video, where frames of video can be synthesized using less than all of the image data that can be captured by a camera module. In a number of embodiments, a single π filter group can be utilized to capture an image. In many embodiments, image data captured by a single π filter group is utilized to capture a preview image prior to capturing image data with a larger number of cameras. In several embodiments, the cameras in a single π filter group capture video image data. Depending upon the requirements of a specific application, image data can be captured using additional cameras to increase resolution and/or provide additional color information and reduce occlusions.

Figure 8:
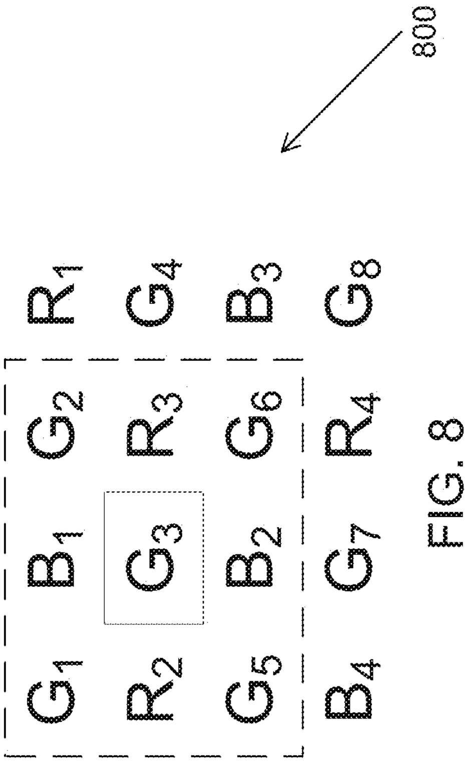
FIG. 8 conceptually illustrates a 4×4 camera module patterned with π filter groups where nine cameras are utilized to capture image data used to synthesize frames of video in accordance with an embodiment of the invention.

A π filter group within a camera module that is utilized to capture image data that can be utilized to synthesize an image is illustrated in FIG. 8. In the illustrated embodiments, the reference camera is boxed and utilized cameras are encompassed in a dotted line. The camera module 800 includes a π filter group of cameras generating image data $G_1$-$G_2$, $G_5$-$G_6$, $B_1$-$B_2$ and $R_2$-$R_3$ with reference camera $G_3$. FIG. 8 illustrates how the cameras in a π filter group can be utilized to capture images. Image data can be acquired using additional cameras for increased resolution and to provide additional color information in occlusion zones. Accordingly, any number and arrangement of cameras can be utilized to capture image data using a camera module in accordance with many different embodiments of the invention.

Building Color Filter Patterns Including π Filter Groups

Color filter patterns for any array of cameras having dimensions greater than 3×3 can be constructed in accordance with embodiments of the invention. In many embodiments, processes for constructing color filter patterns typically involve assigning color filters to the cameras in a camera module to maximize the number of overlapping π filter groups. In the event that there are cameras that cannot be included in a π filter group, then color filters can be assigned to the cameras based upon minimizing occlusions around the camera that is to be used as the reference camera for the purposes of synthesizing high-resolution images.

Figure 9:
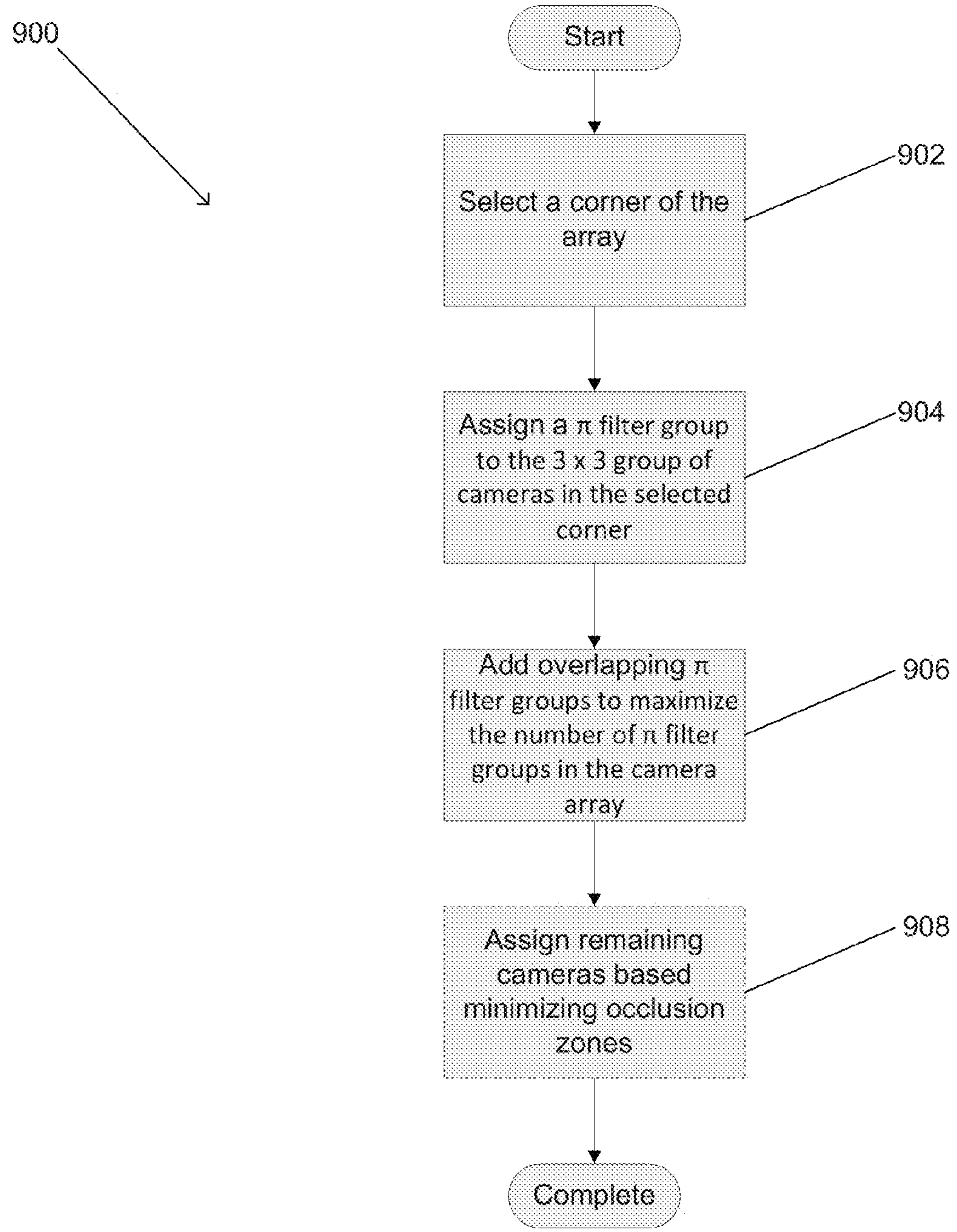
FIG. 9 is a flow chart illustrating a process for generating color filter patterns including π filter groups in accordance with embodiments of the invention.
Figure 10A:
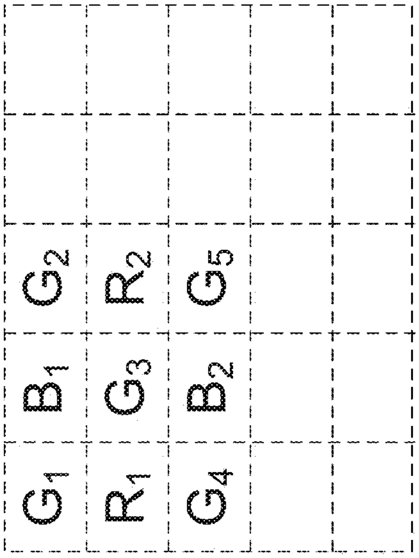
FIGS. 10A-10D illustrate a process for generating a color filter pattern including π filter groups for a 5×5 array of cameras in accordance with embodiments of the invention.
Figure 10B:
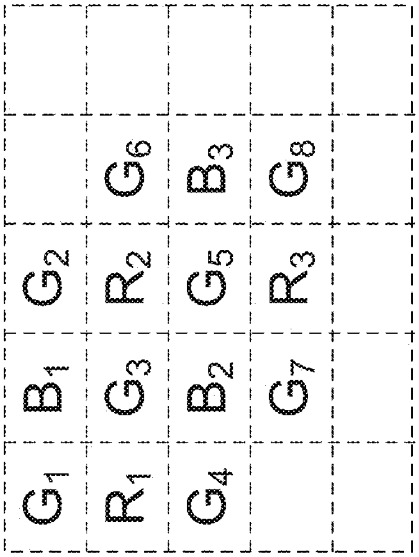
Figure 10C:
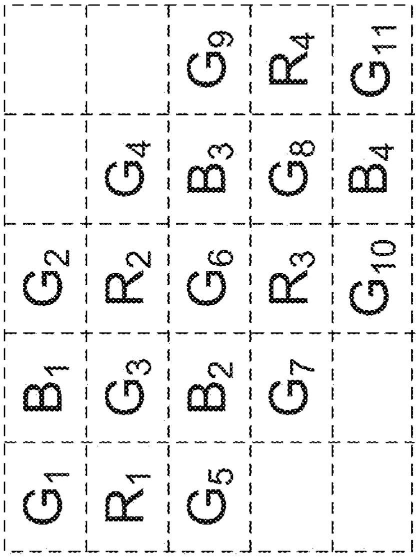
Figure 10D:
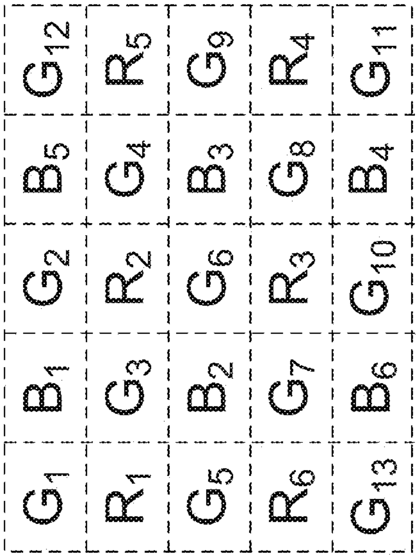
Figure 11A:
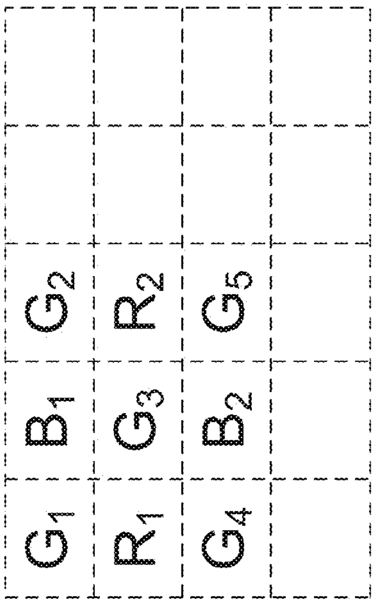
FIGS. 11A-11D illustrate a process for generating a color filter pattern including π filter groups for a 4×5 array of cameras in accordance with embodiments of the invention.
Figure 11B:
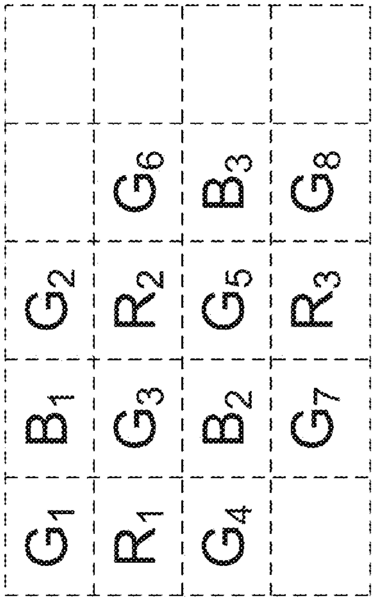
Figure 11C:
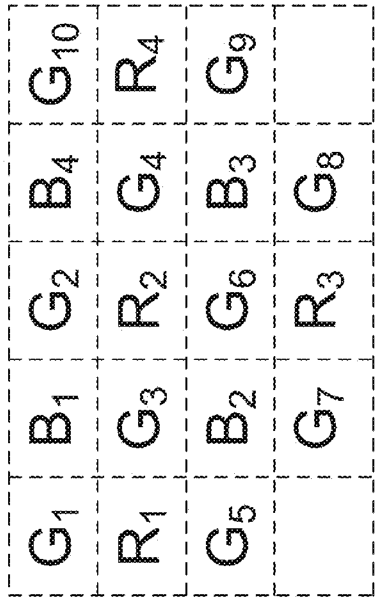
Figure 11D:
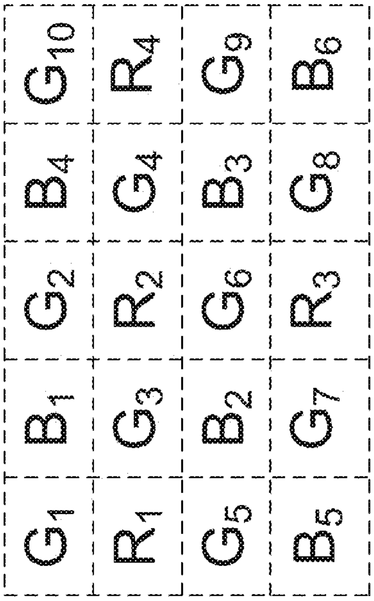

A process for assigning color filters to cameras in a camera module in accordance with an embodiment of the invention is illustrated in FIG. 9. The process 900 includes selecting (902) a corner of the array, assigning (904) a π filter group to the selected corner. The π filter group occupies a 3×3 grid. Color filters can be assigned (906) to the remaining cameras in such a way to maximize the number of overlapping π filter groups within the array. In the event that there are cameras to which color filters are not assigned, the cameras are assigned (908) color filters that reduce the likelihood of occlusion zones in images synthesized from the viewpoint of a camera selected as the reference camera for the array. At which point, all of the cameras in the array are assigned color filters. As noted above, the presence of multiple π filter groups provides benefits including (but not limited to) robustness to failures in specific cameras within the array and the ability to synthesize images with fewer than all of the cameras in the camera module utilizing image data captured by at least one π filter group.

The process of generating a simple filter pattern for a 5×5 array using π filter groups is illustrated in FIGS. 10A-10D. The process starts with the selection of the top left corner of the array. A π filter group is assigned to the 3×3 group of cameras in the top left corner (cameras $G_1$-$G_5$, $B_1$-$B_2$, and $R_1$-$R_2$). A second overlapping π filter group is created by adding three green cameras and a blue camera and a red camera ($G_6$-$G_8$ and $B_3$ and $R_3$). A third overlapping π filter group is created by adding another three green cameras and a blue camera and a red camera ($G_9$-$G_{11}$ and $B_4$ and $R_4$). A fifth and sixth π filter groups are created by adding a single green camera, blue camera and red camera ($G_{12}$, $B_5$, $R_5$ and $G_{13}$, $B_6$, $R_6$). In the event that central camera ($G_6$) fails, a camera at the center of another π filter group can be utilized as the reference camera (e.g. $G_3$).

A similar process for generating a simple filter pattern for a 4×5 array using π filter groups is illustrated in FIGS. 11A-11D. The process is very similar with the exception that two cameras are not included in π filter groups. Due to the fact that there are no blue cameras below the camera $G_6$ (which is the center of a π filter group), the cameras that do not form part of a π filter group are assigned as blue cameras ($B_5$ and $B_6$). As can readily be appreciated similar processes can be applied to any array larger than a 3×3 array to generate a color filter pattern incorporating π filter groups in accordance with embodiments of the invention.

While the above description contains many specific embodiments of the invention, these should not be construed as limitations on the scope of the invention, but rather as an example of one embodiment thereof. It is therefore to be understood that the present invention may be practiced otherwise than specifically described, without departing from the scope and spirit of the present invention. Thus, embodiments of the present invention should be considered in all respects as illustrative and not restrictive.

What is claimed is:

1. An array camera module, comprising:

an M×N imager array comprising a plurality of focal planes, each focal plane comprising an array of light sensitive pixels;

an M×N optic array of lens stacks, where each lens stack corresponds to a focal plane, and where each lens stack forms an image of a scene on its corresponding focal plane;

wherein each pairing of a lens stack and its corresponding focal plane thereby defines a camera;

wherein at least one row in the M×N array of cameras comprises at least one red color camera, at least one green color camera, and at least one blue color camera; and wherein at least one column in the M×N array of cameras comprises at least one red color camera, at least one green color camera, and at least one blue color camera;

wherein a red color camera is a camera that is configured to image only that portion of the electromagnetic spectrum corresponding with red light;

wherein a green color camera is a camera that is configured to image only that portion of the electromagnetic spectrum corresponding with green light; and wherein a blue color camera is a camera that is configured to image only that portion of the electromagnetic spectrum corresponding with blue light.

2. The array camera module of claim 1:

wherein M and N are each greater than two and at least one of M and N is even;

wherein color filters are implemented within the cameras in the array camera module such that the array camera module is patterned with at least one π filter group comprising:

a 3×3 array of cameras comprising:

a reference camera at the center of the 3×3 array of cameras;

two red color cameras located on opposite sides of the 3×3 array of cameras;

two blue color cameras located on opposite sides of the 3×3 array of cameras; and four green color cameras surrounding the reference camera.

3. The array camera module of claim 2 wherein each of the four green color cameras surrounding the reference camera is disposed at a corner location of the 3×3 array of cameras.

4. The array camera module of claim 3, wherein:

M is four;

N is four;

the first row of cameras of the 4×4 array camera module includes, in the following order, a green color camera, a blue color camera, a green color camera, and a red color camera;

the second row of cameras of the 4×4 array camera module includes, in the following order, a red color camera, a green color camera, a red color camera, and a green color camera;

the third row of cameras of the 4×4 array camera module includes, in the following order, a green color camera, a blue color camera, a green color camera, and a blue color camera; and the fourth row of cameras of the 4×4 array camera module includes, in the following order, a blue color camera, a green color camera, a red color camera, and a green color camera.

5. The array camera module of claim 3, wherein:

M is four;

N is four;

the first row of cameras of the 4×4 array camera module includes, in the following order, a red color camera, a green color camera, a blue color camera, and a green color camera;

the second row of cameras of the 4×4 array camera module includes, in the following order a green color camera, a red color camera, a green color camera, and a red color camera;

the third row of cameras of the 4×4 array camera module includes, in the following order, a blue color camera, a green color camera, a blue color camera, and a green color camera; and the fourth row of cameras of the 4×4 array camera module includes, in the following order, a green color camera, a red color camera, a green color camera, and a blue color camera.

6. The array camera module of claim 2, wherein the reference camera is a green color camera.

7. The array camera module of claim 2, wherein the reference camera is one of: a camera that incorporates a Bayer filter, a camera that is configured to capture infrared light, and a camera that is configured to capture ultraviolet light.

8. The array camera module of claim 2 wherein each of the two red color cameras is located at a corner location of the 3×3 array of cameras, and wherein each of the two blue color cameras is located at a corner location of the 3×3 array of cameras.

9. The array camera module of claim 2, wherein at least one color filter is implemented on the imager array.

10. The array camera module of claim 2, wherein at least one color filter is implemented on a lens stack.

11. A 3×3 array camera module comprising:

a 3×3 imager array comprising a 3×3 arrangement of focal planes, each focal plane comprising an array of light sensitive pixels;

a 3×3 optic array of lens stacks, where each lens stack corresponds to a focal plane, and where each lens stack forms an image of a scene on its corresponding focal plane;

wherein each pairing of a lens stack and its corresponding focal plane thereby defines a camera;

wherein the 3×3 array of cameras comprises:

a reference camera at the center of the 3×3 array of cameras;

two red color cameras located on opposite sides of the 3×3 array of cameras;

two blue color cameras located on opposite sides of the 3×3 array of cameras; and four green color cameras, each located at a corner location of the 3×3 array of cameras;

wherein a red color camera is a camera that is configured to image only that portion of the electromagnetic spectrum corresponding with red light;

wherein a green color camera is a camera that is configured to image only that portion of the electromagnetic spectrum corresponding with green light; and wherein a blue color camera is a camera that is configured to image only that portion of the electromagnetic spectrum corresponding with blue light;

wherein each of the color cameras is achieved using a color filter.

12. The 3×3 array camera module of claim 11, wherein at least one color filter is implemented on the imager array to achieve a color camera.

13. The 3×3 array camera module of claim 11, wherein at least one color filter is implemented within a lens stack to achieve a color camera.

14. The 3×3 array camera module of claim 11, wherein the reference camera is a green color camera.

15. The 3×3 array camera module of claim 11, wherein the reference camera is one of: a camera that incorporates a Bayer filter, a camera that is configured to capture infrared light, and a camera that is configured to capture ultraviolet light.

16. A method of patterning an array camera module with at least one π filter group comprising:

evaluating whether an imager array of M×N focal planes, where each focal plane comprises an array of light sensitive pixels, includes any defective focal planes;

assembling an M×N array camera module using:

the imager array of M×N focal planes;

an M×N optic array of lens stacks, where each lens stack corresponds with a focal plane, wherein the M×N array camera module is assembled so that:

each lens stack and its corresponding focal plane define a camera;

color filters are implemented within the array camera module such that the array camera module is patterned with at least one π filter group comprising:

a 3×3 array of cameras comprising:

a reference camera at the center of the 3×3 array of cameras;

two red color cameras located on opposite sides of the 3×3 array of cameras;

two blue color cameras located on opposite sides of the 3×3 array of cameras; and four green color cameras, surrounding the reference camera;

wherein a red color camera is a camera that is configured to image only that portion of the electromagnetic spectrum corresponding with red light;

wherein a green color camera is a camera that is configured to image only that portion of the electromagnetic spectrum corresponding with green light; and wherein a blue color camera is a camera that is configured to image only that portion of the electromagnetic spectrum corresponding with blue light; and wherein the array camera module is patterned with the at least one π filter group such that a camera that includes a defective focal plane is a green color camera.

17. The method of patterning an array camera module with at least one π filter group of claim 16, wherein at least one color filter is implemented on the imager array.

18. The method of patterning an array camera module with at least one π filter group of claim 16, wherein at least one color filter is implemented within a lens stack.

19. The method of patterning an array camera module with at least one π filter group of claim 16, wherein the reference camera is a green color camera.

20. The method of patterning an array camera module with at least one π filter group of claim 16, wherein the reference camera is one of: a camera that incorporates a Bayer filter, a camera that is configured to capture infrared light, and a camera that is configured to capture ultraviolet light.

* * * * *